United States Patent
Romano

(10) Patent No.: US 11,625,509 B2
(45) Date of Patent: *Apr. 11, 2023

(54) METHOD OF MANUFACTURING COMPLEX THREE-DIMENSIONAL BUILDING SURFACES

(71) Applicant: 3 Palms Group, LLC, Saint Thomas Parish (KN)

(72) Inventor: Mario Romano, Santa Monica, CA (US)

(73) Assignee: 3 Palms Group, LLC, Saint Thomas Parish (KN)

( * ) Notice: Subject to any disclaimer, the term of this patent is extended or adjusted under 35 U.S.C. 154(b) by 85 days.

This patent is subject to a terminal disclaimer.

(21) Appl. No.: 17/146,357

(22) Filed: Jan. 11, 2021

(65) Prior Publication Data

US 2021/0240877 A1 Aug. 5, 2021

Related U.S. Application Data

(63) Continuation of application No. 16/422,896, filed on May 24, 2019, now Pat. No. 10,891,404, which is a continuation-in-part of application No. 15/582,483, filed on Apr. 28, 2017, now Pat. No. 10,732,596.

(60) Provisional application No. 62/467,028, filed on Mar. 3, 2017, provisional application No. 62/331,927, filed on May 4, 2016.

(51) Int. Cl.
*G06F 30/13* (2020.01)

(52) U.S. Cl.
CPC .................................. *G06F 30/13* (2020.01)

(58) Field of Classification Search
CPC ...................................................... G06F 30/13
See application file for complete search history.

(56) References Cited

U.S. PATENT DOCUMENTS

| | | |
|---|---|---|
| 5,011,411 A | 4/1991 | Loewy |
| 6,888,147 B1 | 5/2005 | Hansson et al. |
| 8,256,179 B2 | 9/2012 | Nasvik |
| 9,175,482 B2 | 11/2015 | Olma et al. |
| 2006/0003144 A1 | 1/2006 | Kaump |
| 2009/0123692 A1 | 5/2009 | Kaump |
| 2010/0274374 A1 | 10/2010 | Konstantinidis |
| 2011/0054652 A1 | 3/2011 | Heil |

(Continued)

OTHER PUBLICATIONS

Homedit, A surprisingly spacious 60 square meter residence, Aug. 22, 2012, Retrieved from online. https://www.homedit.com/a-surprisingly-spacious-60-square-meter-residence/(Year: 2012).

*Primary Examiner* — Mohammad Ali
*Assistant Examiner* — Sheela Rao
(74) *Attorney, Agent, or Firm* — Sheppard, Mullin, Richter & Hampton LLP

(57) ABSTRACT

A method implemented by a computer system, the computer-implemented method comprising receiving dimensions of a building surface, including a surface length and a surface height; receiving dimensions of a surface material unit, including a material length and a material height; receiving design parameters defining a three-dimensional design over the building surface; partitioning the three-dimensional design into a plurality of three-dimensional segments based on both the three-dimensional design and the dimensions of the surface material; and generating a set of milling instructions for cutting a plurality of surface material units into the plurality of three-dimensional segments.

17 Claims, 21 Drawing Sheets

(56) References Cited

U.S. PATENT DOCUMENTS

| | | |
|---|---|---|
| 2011/0178777 A1 | 7/2011 | Carey |
| 2014/0156049 A1 | 6/2014 | Walker |
| 2016/0019321 A1 | 1/2016 | Zahner et al. |
| 2017/0322533 A1 | 11/2017 | Romano |

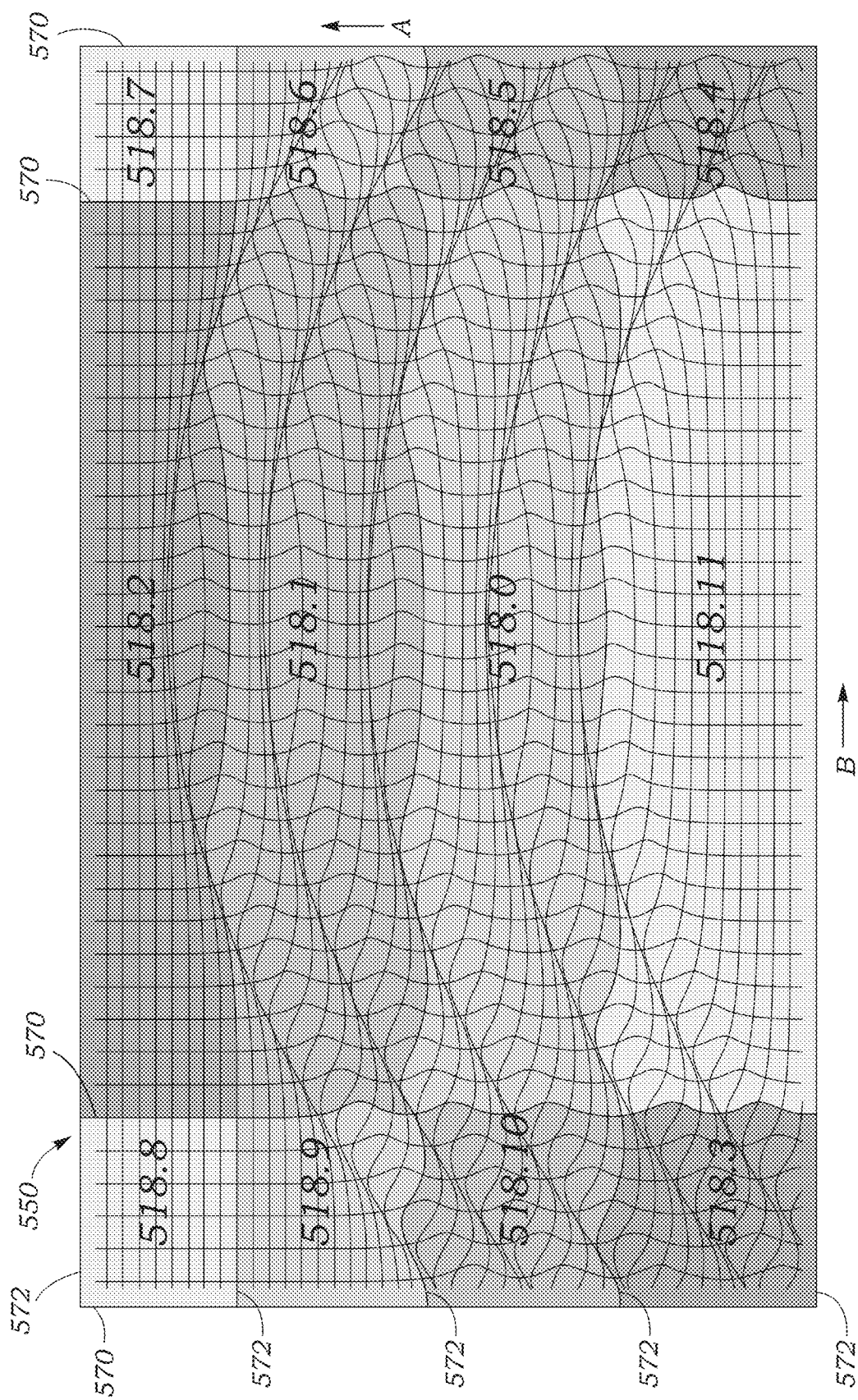

METHOD OF MANUFACTURING COMPLEX THREE-DIMENSIONAL BUILDING SURFACES

CROSS-REFERENCE TO RELATED APPLICATION

The present application is a continuation of U.S. patent application Ser. No. 16/422,896, filed May 24, 2019, now U.S. Pat. No. 10,891,404 B2 which is a continuation-in-part of U.S. patent application Ser. No. 15/582,483, filed Apr. 28, 2017, now U.S. Pat. No. 10,732,596 B2 which claims priority to U.S. Provisional Patent Application No. 62/467,028, entitled "Method of Manufacturing Complex Three-Dimensional Building Surfaces," filed Mar. 3, 2017, and to U.S. Provisional Patent Application No. 62/331,927, entitled "Method of Manufacturing Complex Three-Dimensional Building Surfaces," filed May 4, 2016. The entire contents of these related applications are incorporated into this application by reference.

FIELD OF THE INVENTION

The present invention relates generally to a method of manufacturing building surfaces and, more particularly, to a method of manufacturing complex three-dimensional building surfaces using solid surface material.

BACKGROUND

Interior wall and ceiling surfaces are typically covered with drywall, which can easily be patched and painted to create smooth, flat surfaces. However, design options for drywall surfaces are generally limited to paint selection as drywall cannot be milled to create three-dimensional surfaces or patterns.

Solid surface material, such as Corian LG Hi Mac, Krion, Arishtech Avonite, Meganite, Samsung Staron, Swan Swanstone, or Wilsonart Solid Surface, is generally a non-porous, low-maintenance material often used for countertops. Unlike drywall, solid surface material can be milled to create three-dimensional surfaces and patterns such as grooves or surface contours.

However, existing technology and installation techniques make it difficult, time consuming, and expensive to use solid surface material for anything other than countertops, let alone interior and exterior building surfaces, such as walls, ceilings, floors, and roofs. For example, unlike drywall, the adjoining areas between units of solid surface material cannot easily be patched and painted to create a seamless surface. Rather, these adjoining areas require extensive sanding by expert installers. This laborious installation process can be expensive and time-consuming.

Indeed, even with expensive, expert installation, the seams between adjoining surface material units can be difficult to conceal. This task is made more arduous when the surface material units are etched or contoured to include a three-dimensional design. For example, the grooves or contour patterns on the surface material units can be difficult to align and, even when properly aligned, often act to highlight the seams between units. Existing methods for manufacturing decorative building surfaces have largely been limited to repetitive, three-dimensional tile pieces, which have limited design potential and are time-consuming to install. The present invention addresses these problems involved in the prior art and provides further related advantages.

BRIEF SUMMARY OF THE INVENTION

The present invention is embodied in methods, systems, and non-transitory computer readable media configured to receive dimensions of a building surface, dimensions of a surface material unit, and design parameters. The dimensions of the building surface include a surface length and a surface height, the dimensions of the surface material unit include material length and material height, and the design parameters define a three-dimensional design over the building surface. In some embodiments, the design parameters comprise a design element and one of a plurality of design styles, wherein the design element comprises an image element, a drawn element, or both; and each of the plurality of design styles comprises a predefined value for each of a plurality of shape parameters. The three-dimensional design is partitioned into a plurality of three-dimensional segments based on both the three-dimensional design and the dimensions of the surface material unit. The methods, systems, and non-transitory computer readable media are further configured to generate a set of milling instructions for cutting a plurality of surface material units into the plurality of three-dimensional segments.

In one embodiment, the three-dimensional design can be a parametric design. In another embodiment, the three-dimensional design can be non-repetitive and have an area at least as large as an area of the building surface. In a further embodiment, the area of the building surface can be at least 50 square meters.

In one embodiment, the three-dimensional design can comprise a first series of lines extending generally in a first direction, and partitioning the three-dimensional design can comprise dividing each line in the first series of lines into a first set of points.

In one embodiment, the plurality of shape parameters can comprise a first line-density parameter, which defines a distance between lines in the first series of lines. In another embodiment, the plurality of shape parameters can comprise a first point-resolution parameter, which defines a quantity of points in the first set of points. In a further embodiment, the plurality of shape parameters can comprise a first radius-of-attraction parameter, which defines a radius of attraction between the first set of points on the first series of lines and the design element. In an additional embodiment, the plurality of shape parameters can comprise a first attraction-intensity parameter, which defines a degree of attraction between the first set of points on the first series of lines and the design element. In one embodiment, the plurality of shape parameters can comprise a first minimum-depth parameter, which defines a minimum depth for the first series of lines when affected by a design element. In one embodiment, the plurality of shape parameters can comprise a first maximum-depth parameter, which defines a maximum depth for the first series of lines when affected by a design element. In another embodiment, the plurality of shape parameters can comprise a first function parameter, which comprises a first function that adds periodicity to the first series of lines. In a further embodiment, the plurality of shape parameters can comprise a first line-thickness parameter, which defines a thickness of the lines in the first series of lines. In one embodiment, the plurality of shape parameters can comprise a multiplier parameter, which defines an amount by which one or more of the other design parameters can be multiplied to scale the overall effect. In yet another embodiment, the plurality of shape parameters can comprise at least two of the foregoing parameters.

In another embodiment, the surface height can be less than or equal to the material height, and partitioning the three-dimensional design can further comprise iteratively setting lines in the first series of lines as seam lines if a horizontal distance between any point on a next line in the first series of lines and any point on a latest seam line exceeds a first dimensional threshold. In a further embodiment, the first dimensional threshold can be determined based on the material length.

In an alternative embodiment, the surface length can be less than or equal to the material length, and partitioning the three-dimensional design can further comprise iteratively setting lines in the first series of lines as seam lines if a vertical distance between any point on a next line in the first series of lines and any point on a latest seam line exceeds a first dimensional threshold. In a further embodiment, the first dimensional threshold can be determined based on the material height.

In one embodiment, the three-dimensional design can comprise a first series of lines extending generally in a first direction and a second series of lines extending generally in a second direction. In another embodiment, the first direction can be different from the second direction. In a further embodiment, partitioning the three-dimensional design can comprise dividing each line in the first and second series of lines into a set of points. In an additional embodiment, the three-dimensional design can comprise a contoured surface. In yet another embodiment, the lines in the first series of lines and the lines in the second series of lines can be curved.

In one embodiment, the plurality of shape parameters can comprise a second line-density parameter, which defines a distance between lines in the second series of lines. In another embodiment, the plurality of shape parameters can comprise a second point-resolution parameter, which defines a quantity of points in the second set of points. In a further embodiment, the plurality of shape parameters can comprise a second radius-of-attraction parameter, which defines a radius of attraction between the second set of points on the second series of lines and the design element. In an additional embodiment, the plurality of shape parameters can comprise a second attraction-intensity parameter, which defines a degree of attraction between the second set of points on the second series of lines and the design element. In one embodiment, the plurality of shape parameters can comprise a second minimum-depth parameter, which defines a minimum depth for the second series of lines when affected by a design element. In one embodiment, the plurality of shape parameters can comprise a second maximum-depth parameter, which defines a maximum depth for the second series of lines when affected by a design element. In another embodiment, the plurality of shape parameters can comprise a second function parameter, which comprises a second function that adds periodicity to the second series of lines. In a further embodiment, the plurality of shape parameters can comprise a second line-thickness parameter, which defines a thickness of the lines in the second series of lines. In one embodiment, the plurality of shape parameters can comprise a multiplier parameter, which defines an amount by which one or more of the other design parameters can be multiplied to scale the overall effect. In yet another embodiment, the plurality of shape parameters can comprise at least two of the foregoing parameters.

In one embodiment, partitioning the three-dimensional design can further comprise iteratively setting lines in the first series of lines as seam lines in a first set of seam lines if a horizontal distance between any point on a next line in the first series of lines and any point on a latest seam line in the first set of seam lines exceeds a first dimensional threshold, wherein the first dimensional threshold is determined based on the material length; and iteratively setting lines in the second series of lines as seam lines in a second set of seam lines if a vertical distance between any point on a next line in the second series of lines and any point on a latest seam line in the second set of seam lines exceeds a second dimensional threshold, wherein the second dimensional threshold is determined based on the material height.

In one embodiment, the methods, systems, and non-transitory computer readable media can further comprise receiving modified design parameters for a modified three-dimensional design; adjusting one or a combination of the first series of lines and the second series of lines based on the modified design parameters; and repartitioning the modified three-dimensional design into a modified plurality of segments based on the modified three-dimensional design and the dimensions of the surface material units.

In one embodiment, the methods, systems, and non-transitory computer readable media can further comprise cutting the plurality of surface material units into the plurality of three-dimensional segments. In another embodiment, the methods, systems, and non-transitory computer readable media can further comprise generating a set of instructions for assembling the plurality of three-dimensional segments onto the building surface to create the three-dimensional design over the building surface.

Other features and advantages of the invention should become apparent from the following description of the preferred embodiments, taken in conjunction with the accompanying drawings, which illustrate, by way of example, the principles of the invention.

BRIEF DESCRIPTION OF THE DRAWINGS

FIG. 5C illustrates a design page showing a rendering of a three-dimensional design over a building surface area in accordance with one embodiment of the present disclosure.

DETAILED DESCRIPTION OF THE PREFERRED EMBODIMENTS

An improved approach rooted in computer technology overcomes the previously discussed and other difficulties associated with conventional approaches. Based on computer technology, the disclosed technology can automatically partition a three-dimensional design into a plurality of three-dimensional segments that can be assembled to create a non-repeating, seamless, three-dimensional design for a building surface. The three-dimensional design and dimensions of a surface material unit can be used to determine how to partition the three-dimensional design into the plurality of three-dimensional segments. In certain embodiments, the three-dimensional design can be automatically partitioned such that partition edges are generated along curves included in the three-dimensional design. In this way, when the three-dimensional segments are joined together, they are joined together at existing curves which hide any seams caused by partition edges. The partitioned three-dimensional design can be used to generate milling instructions for cutting a plurality of surface material units into three-dimensional design segments that can be assembled into the three-dimensional design. Low-skilled workers can easily assemble the segments over a building surface area—without extensive sanding or finishing—to create a non-repeating, ornate, and seamless, three-dimensional design.

Figure 1:
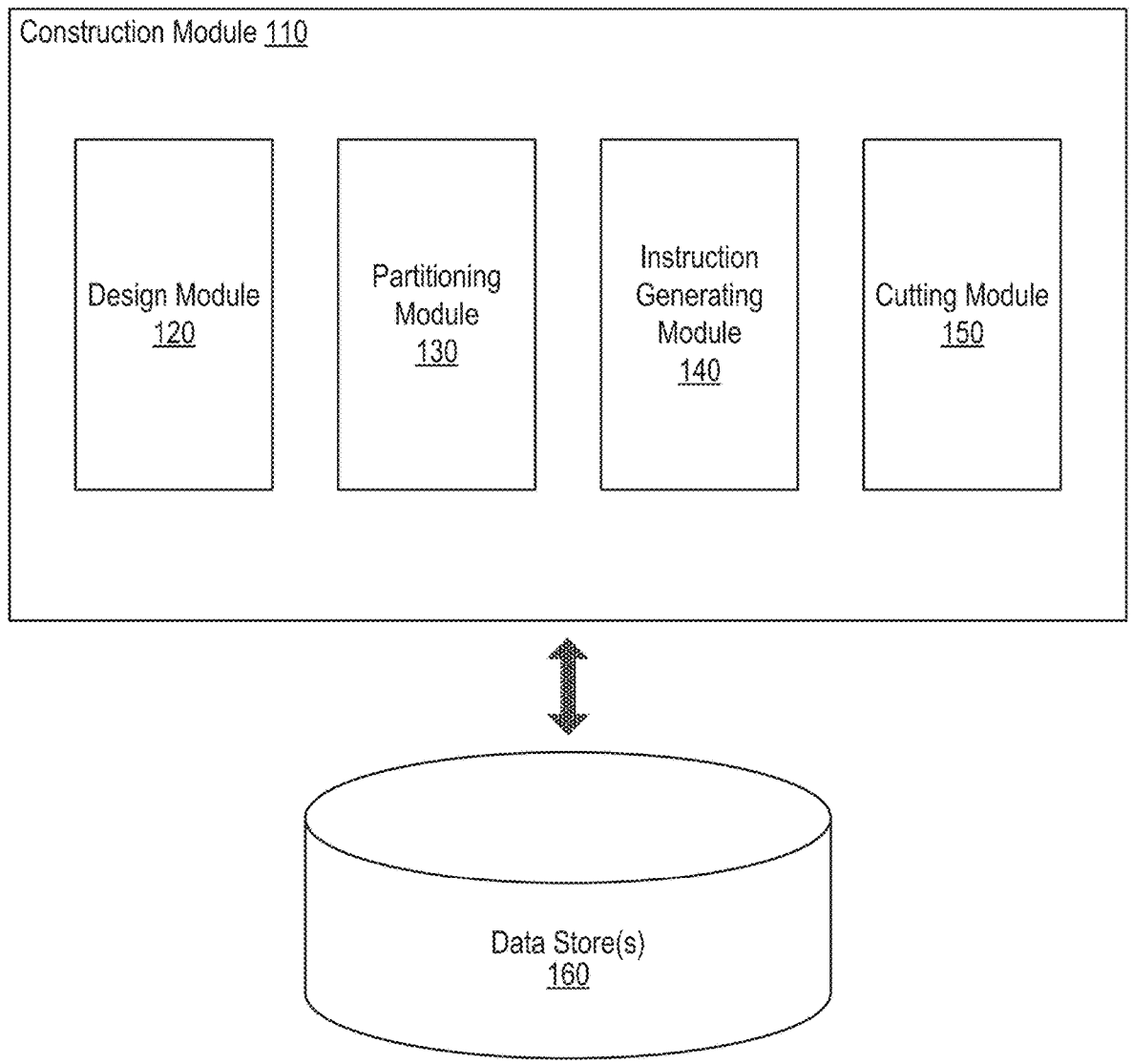
FIG. 1 illustrates a system including a construction module in accordance with one embodiment of the present disclosure.

With reference now to FIG. 1 of the illustrative drawings, there is shown a system 100 including a construction module 110 configured to partition a three-dimensional design into a plurality of three-dimensional segments that can be assembled to create a seamless three-dimensional design on a building surface, in accordance with one embodiment. The construction module 110 can be configured to receive dimensions of a building surface, dimensions of a surface material unit, and design parameters. The dimensions of the building surface can include, for example, a surface length and a surface height. The dimensions of the surface material unit can include, for example, one or more material lengths and one or more material heights. The design parameters can define a three-dimensional design. In certain embodiments, the three-dimension design can be designed for the building surface. The three-dimensional design is partitioned into the plurality of three-dimensional segments based on both the three-dimensional design and the dimensions of the surface material unit. The methods, systems, and non-transitory computer readable media are further configured to generate a set of milling instructions for cutting a plurality of surface material units into the plurality of three-dimensional segments.

As shown in FIG. 1, in one embodiment, the construction module 110 can include a design module 120, a partitioning module 130, an instruction generating module 140, and a cutting module 150. In some instances, the example system 100 can include at least one data store 110. The components (e.g., modules, elements, etc.) shown in this and all other figures are exemplary only, and other implementations can include additional, fewer, integrated, or different components. For example, in another embodiment, the construction module 110 might not include the cutting module 150. Some components might not be shown so as not to obscure relevant details.

The construction module 110 can be implemented, in part or in whole, as software, hardware, or as a combination of software and hardware. In general, a module can be associated with software, hardware, or any combination of software and hardware. In some cases, the construction module 110 can be implemented, in part or in whole, as software running on one or more computer devices or systems, such as on a server computing system or a user (or client) computing system. For example, the construction module 110, or at least a portion of it, can be implemented as or within an application, a program, or an applet, etc., running on a user computing device or a client computing system, such as the user device 710 of FIG. 7. In another example, the construction module 110, or at least a portion of it, can be implemented using one or more computing devices or systems that include one or more servers, such as network servers or cloud servers. In some instances, the construction module 110 can, in part or in whole, be implemented within or configured to operate in conjunction with a Computer Numeric Control (CNC) system, such as the CNC system 720 of FIG. 7. For example, in one embodiment, the cutting module 150 can be implemented, in part or in whole, as software running on the CNC system 720 of FIG. 7. It should be understood that there can be many variations or other possibilities.

The design module 120 can be configured to receive dimensions of a building surface, dimensions of a surface material unit, and design parameters. The dimensions of the building surface can include, for example, a surface length and a surface height. The dimensions of the surface material unit can include, for example, material length and material height. The design parameters can define a three-dimensional design over the building surface. In addition, in one embodiment, the design module 120 can be configured to further receive dimensions of a CNC machine, including a machine length and a machine width. The design module 120 is described in greater detail below.

The partitioning module 130 can be configured to partition the three-dimensional design into a plurality of three-dimensional segments based on both the three-dimensional design and the dimensions of the surface material unit. The partitioning module 130 is described in greater detail below.

The instruction generating module 140 can be configured to produce a set of milling instructions and a set of assembly instructions. In one embodiment, the instruction generating module 140 can be configured to produce a set of computer-readable instructions that can be interpreted to extract the commands needed to operate a particular cutting machine for production of the plurality of three-dimensional segments. For example, the instructions can comprise Computer Numeric Control (CNC) instructions, such as G-code, which is readable by, for example, a CNC milling machine. In another embodiment, the instruction generating module 140 can be configured to produce a set of instructions for assembling the plurality of three-dimensional segments on the building surface. The instruction generating module 140 is described in greater detail below.

The cutting module 150 can be configured to interpret a set of computer-readable instructions to extract the commands needed to operate a particular cutting machine for production of the plurality of three-dimensional segments. Milling is a cutting process that uses a milling cutter to remove material from the surface of a workpiece. Milling machines, and other cutting tools, have become automated, for example, through the use of Computer Numerical Control (CNC). Rather than being manually operated, CNC machines are operated by programmed commands from a standardized set of instructions, such as G-code. Accordingly, in one embodiment, the cutting module 150 translates the cutting instructions into commands to move a milling spindle to various locations and depths and otherwise guide the cutting machine for desired operation.

Furthermore, in one embodiment, the construction module 110 can be configured to communicate or operate with the at least one data store 160, as shown in the example system 100. The data store 160 can be configured to store and maintain various types of data. In some implementations, the data store 160 can store information associated with the construction system (e.g., one or both of the user device 710 and the CNC system 720 of FIG. 7). The information associated with the construction system can include, for example, data about building dimensions, design parameters, surface materials, cutting equipment, and various other types of data. It is contemplated that there can be many variations or other possibilities.

Figure 2:
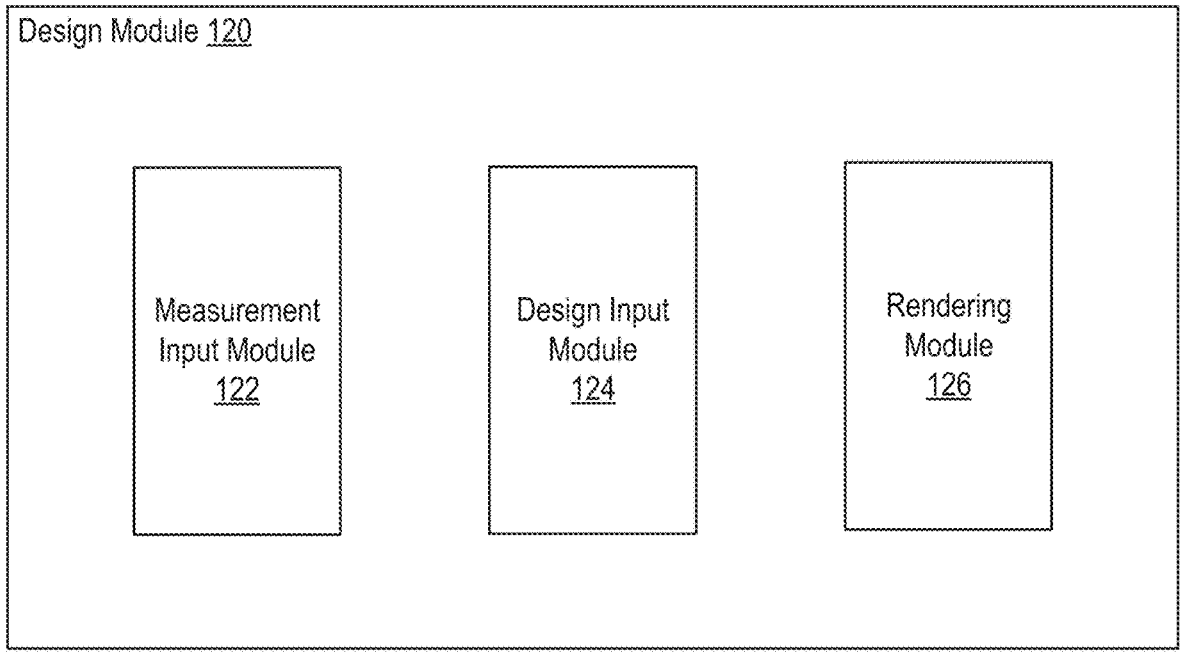
FIG. 2 illustrates a design module in accordance with one embodiment of the present disclosure.

FIG. 2 illustrates a design module 120 configured to receive the dimensions of a building surface, the dimensions of surface material units, and design parameters in accordance with one embodiment of the present disclosure. As shown in FIG. 2, the design module 120 can include a measurement input module 122, a design input module 124, and a rendering module 126. In one embodiment, the design module 120 does not include the rendering module 126.

The measurement input module 122 can be configured to receive dimensions of a building surface and dimensions of one or more surface material units. The dimensions of a building surface, such as a living room wall, can include a surface length (e.g., 155 inches) and a surface height (e.g., 90 inches). The dimensions of a surface material unit, such as a unit of Corian, can include a material length (e.g., 144 inches) and a material height (e.g., 30 inches). In certain embodiments, each unit of a plurality of surface material units has the same dimensions. In an alternative embodiment, a plurality of dimensions for a plurality of surface material units can be defined. In one embodiment, the measurement input module 122 can be configured to further receive dimensions of a CNC machine. The dimensions of a CNC machine can include, for example, a machine length (e.g., 96 inches) and a machine width (e.g., 30 inches).

The design input module 124 can be configured to receive design parameters defining a three-dimensional design for a building surface. In one embodiment, the three-dimensional design defined by the design parameters can be non-repetitive (i.e., substantially without repeating segments or portions) and have an area at least as large as an area of the building surface. In certain embodiments, the area of the building surface is at least 50 square meters. In certain embodiments the three-dimensional design comprises a contoured surface. Accordingly, in an additional embodiment, the design input module 124 can be configured to receive parameters to define the contoured surface over the building surface area.

In one embodiment, the three-dimensional design defined by the design parameters comprises a first series of lines extending generally in a first direction. In another embodiment, the three-dimensional design defined by the design parameters further comprises a second series of lines extending generally in a second direction, wherein the first direction is different from the second direction. In a further embodiment, the lines in the first or second series of lines can define grooves that can be carved into a surface material unit. The term "lines" as used in this application, can include lines that are straight, curved, zigzag, or any combination of these. For example, in an additional embodiment, the first series of lines and the second series of lines can form a grid-like pattern on a plurality of virtual surface material units assembled over a virtual building surface.

Accordingly, in one embodiment, the design input module 124 can be configured to receive design parameters defining the configuration of the first series of lines, the second series of lines, or both. For example, the design input module 124 can be configured to define a first series of lines or both the first series of lines and a second series of lines.

In one embodiment, the design parameters can comprise a design element. The design element can comprise an image element, a drawn element, or both. For example, the design input module 124 can be configured to receive one or more image elements (e.g., images, photographs, or drawings), such as a photograph of a Zebra, drawn over the design area. In addition, the design input module 124 can be configured to receive one or more drawn design elements or geometry, such as a series of arches, drawn over the design area.

In some embodiments, the design parameters can further comprise a value for one or more shape parameters. For example, the shape parameter can include a line-density parameter, which defines a distance between lines in the first or second series of lines. In one embodiment, the shape parameter can include a minimum-depth parameter, which defines a minimum depth for the series of lines when affected by a design element. In another embodiment, the shape parameter can include a maximum-depth parameter, which defines a maximum depth for the series of lines when affected by a design element. In a further embodiment, the shape parameter can include a function parameter, which comprises a function that adds periodicity to the series of lines. In an additional embodiment, the shape parameter can include a line-thickness parameter, which defines a thickness of the lines in the series of lines.

For example, the design input module 124 can be configured to receive a density of the first series of lines (e.g., 1 line per inch) and a density of the second series of lines (e.g., 3 lines per inch), which can define the density of the grid-like pattern of the three-dimensional design. In a further embodiment, the design input module 124 can be configured to receive a thickness of the first series of lines and a thickness of the second series of lines, which can define the width of the grooves cut into the surface material units in the two sets of lines. In an additional embodiment, the design input module 124 can be configured to receive a depth of the first series of lines and a depth of the second series of lines, which can define the depth of the grooves cut into the surface material units in the two sets of lines. In yet another embodiment, the design input module 124 can be configured to receive parameters for a sine expression that can be applied to the first and second series of lines to add one or more sinusoidal curved lines to one or both of the two sets of lines.

As is discussed in more detail below (in connection with the design deconstruction module 132), in some embodiments, each line in the first and second series of lines can be divided into a set of points. For these embodiments the shape parameters can include a point-resolution parameter, which defines the number of points in the set of points.

In certain embodiments, drawn design elements or geometry can modify the first series of lines, and, if included, the second series of lines. For example, the lines in the first and second series of lines can bend towards (e.g., be attracted to) the drawn geometry or away from (e.g., be repelled by) the drawn geometry. Similarly, in certain embodiments, the image element can modify the first series of lines, and, if included, the second series of lines. For example, the lines in the first and second series of lines can bend towards (e.g., be attracted to) or away from (e.g., be repelled by) darker (or lighter) regions of the image element. For these embodiments, the shape parameters can include a radius-of-attraction parameter, which defines a radius of attraction between the set of points on the series of lines and the design element. In other words, the first radius-of-attraction parameter defines a maximum distance of attraction around a design element. If the distance between a control point and the design element is lower than this radius, the control point will not be affected by the design element. In a further embodiment, the shape parameters can include an attraction-intensity parameter, which defines a degree of attraction between a set of points on the series of lines and the design element. In other words, the attraction-intensity parameter defines a maximum distance a control point on a line in the first series of lines will move in the second direction when being attracted by a design element.

For example, the design input module 124 can receive an attraction shape (e.g., 1 inch), which can define a radius of attraction between points on the first and second series of lines and a drawn geometry. In another embodiment, the design input module 124 can be configured to receive an attraction intensity for the first series of lines, which can define a degree of attraction between points on the first series of lines and the drawn geometry. In a further embodiment, the design input module 124 can be configured to receive an attraction intensity for the second series of lines, which can define a degree of attraction between points on the second series of lines and the drawn geometry. In certain embodiments, the design input module 124 can be configured to receive an attraction intensity for any drawn geometry, which can define a degree of attraction between points on the first and second series of lines and the drawn geometry.

Similarly, in certain embodiments, the design input module 124 can receive an attraction shape (e.g., 1 inch), which can define a radius of attraction between points on the first and second series of lines and the dark (or light) regions of an image element. In another embodiment, the design input module 124 can be configured to receive an attraction intensity for the first series of lines, which can define a degree of attraction between points on the first series of lines and the dark (or light) regions of the image element. In a further embodiment, the design input module 124 can be configured to receive an attraction intensity for the second series of lines, which can define a degree of attraction between points on the second series of lines and the dark (or light) regions of the image element. In certain embodiments, the design input module 124 can be configured to receive an attraction intensity for any image element, which can define a degree of attraction between points on the first and second series of lines and the dark (or light) regions of the image element.

In one embodiment, the design input module 124 can be configured to receive design parameters for a parametric, three-dimensional design. For example, the design parameters can be edited or manipulated to define and modify an ornate, three-dimensional design.

In certain embodiments, the design input module 124 can be configured to receive an offset value for a horizontal direction and an offset value for a vertical direction. In one embodiment, the horizontal and vertical offset values can define the horizontal and vertical positioning of the plurality of surface material units over the building surface area.

In the preceding examples, the received design-parameters include a value (e.g., 3) for one or more shape parameters (e.g., line density). In other embodiments, the design parameters can instead comprise one of a plurality of design styles, or "brushstrokes." For these embodiments, each of the plurality of design styles can comprise a predefined value for each of a plurality of shape parameters. For example, a first brushstroke might define a predefined value (e.g., 0.8) for the line-density parameter, a predefined value (e.g., 0.5) for the radius-of-attraction parameter, a predefined value (e.g., 2.0) for the attraction-intensity parameter, a predefined value (e.g., 0.10) for the minimum-depth parameter, a predefined value (e.g., 0.35) for the maximum-depth parameter, a predefined value (e.g., sin(x)) for the function parameter, and a predefined value (e.g., 7) for the line-thickness parameter. A second brushstroke might include different values for one or more of these parameters, a subset of these parameters, or both. In this way, a user can quickly select and switch between multiple brushstrokes, each of which has a unique style when applied to a design element.

The rendering module 125 can be configured to produce a rendered image of a virtual building surface, a plurality of virtual surface material units over the building surface, and the three-dimensional design.

Figure 3:
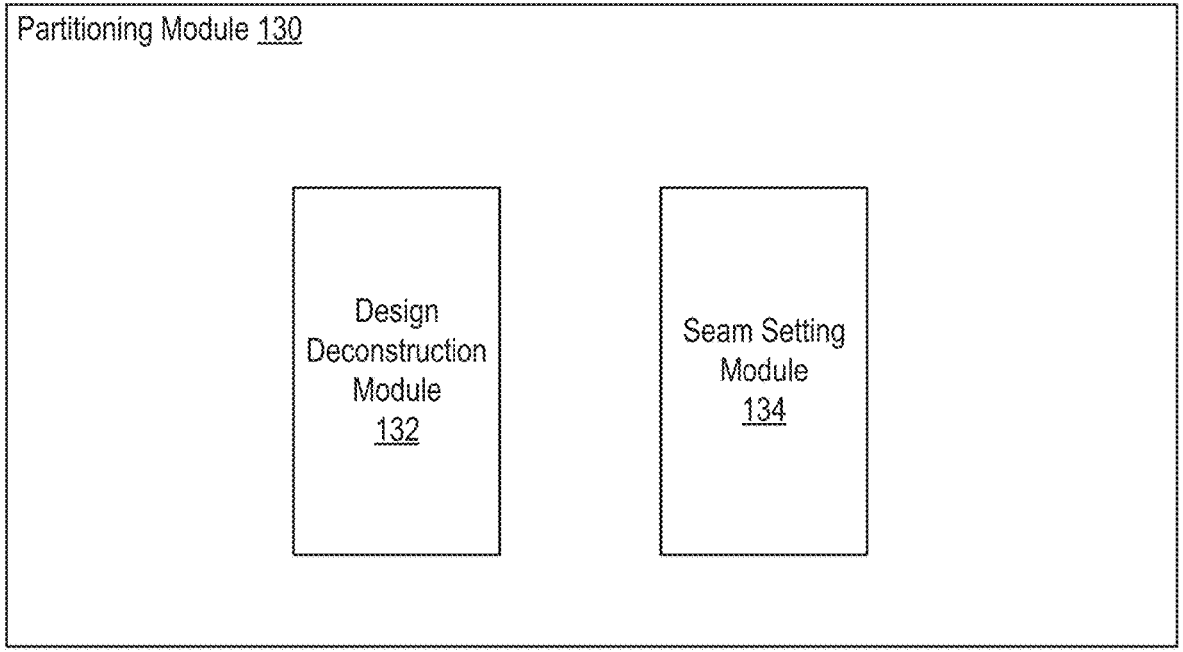
FIG. 3 illustrates a partitioning module in accordance with one embodiment of the present disclosure.

FIG. 3 illustrates a partitioning module 130 configured to partition a three-dimensional design into a plurality of three-dimensional segments based on both a three-dimensional design and dimensions of one or more surface material units, in accordance with one embodiment. As shown in FIG. 3, the partitioning module 130 can include a design deconstruction module 132 and a seam setting module 134.

The design deconstruction module 132 can be configured to divide each line in the first and second series of lines into a set of points. For example, in one embodiment, the design deconstruction module 132 can create a first index of the lines in the first series of lines and a second index of the lines in the second series of lines. In another embodiment, the design deconstruction module 132 can divide each of the lines in the indexes into a series of points and create an first index of the points on each line in the first index of lines and a second index of points on each line in the second index of lines.

The seam setting module 134 can be configured to set appropriate lines in the first series of lines as seam lines. In one embodiment, seam lines can represent where surface material units should be cut to form three-dimensional segments. In another embodiment, the seam setting module 134 can identify groove lines that should be set as seam lines so as to obscure the seams when the plurality of three-dimensional segments are assembled over a building surface area.

In one embodiment, the seam setting module 124 can create a first index of seam lines representing seam lines in the first series of lines. For example, if the surface height is less than or equal to the material height, the seam setting module 134 can iteratively set lines in the first series of lines as seam lines in a first set of seam lines if a horizontal distance between any point on a next line in the first series of lines and any point on a latest seam line in the first set of seam lines exceeds a first dimensional threshold. In another embodiment, the first dimensional threshold can be determined based on the material length. For example, in a further embodiment, the first dimensional threshold can be the material length minus a tolerance value.

Alternatively, if the surface length is less than or equal to the material length, the seam setting module 134 can iteratively set lines in the first series of lines as seam lines in a first set of seam lines if a vertical distance between any point on a next line in the first series of lines and any point on a latest seam line in the first set of seam lines exceeds a first dimensional threshold. In another embodiment, the first dimensional threshold can be determined based on the material height. For example, in a further embodiment, the first dimensional threshold can be the material height minus a tolerance value.

When three-dimensional design includes a second series of lines, the seam setting module 134 can be configured to set appropriate lines in the first and second series of lines as seam lines. In one embodiment, the seam setting module 124 can create a first index of seam lines representing seam lines in the first series of lines. In another embodiment, the seam setting module 124 can create a second index of seam lines representing seam lines in the second series of lines.

In one embodiment, the seam setting module 134 iteratively sets lines in the first series of lines as seam lines in a first set of seam lines if a horizontal distance between any point on a next line in the first series of lines and any point on a latest seam line in the first set of seam lines exceeds a first dimensional threshold. In another embodiment, the first dimensional threshold can be determined based on the material length. For example, in a further embodiment, the first dimensional threshold can be the material length minus a tolerance value.

In one embodiment, the seam setting module 134 can loop through the first index of lines and the first index of points to identify one or more points on each of the first series of lines having a minimum distance in the horizontal direction ($X_{min}$ point). In another embodiment, the seam setting module 134 can loop through the first index of lines and the first index of points to identify one or more points on each of the first series of lines having a maximum distance in the horizontal direction ($X_{max}$ point).

In one embodiment, the seam setting module 134 can set the first line in the first index of lines as the first seam line. The seam setting module 134 can then move to a next line in the first index of lines to determine whether the horizontal distance between the next line's $X_{max}$ point to the latest seam line's $X_{min}$ point exceeds the first dimensional threshold. If the next line's $X_{max}$ point to the latest seam line's $X_{min}$ point does not exceed the first dimensional threshold, then the seam setting module 134 can move to the next line in the first index of lines. This continues until it is determined that for a particular line, the line's $X_{max}$ point to the latest seam line's $X_{min}$ point exceeds the first dimensional threshold. When this occurs, the seam setting module 134 can set the previous line in the first index of lines as a seam line. The new seam line can be added to the first index of seam lines, and the seam setting module 134 can step through the next lines in the first index of lines to determine whether the horizontal distance between the next line's $X_{max}$ point to the latest seam line's $X_{min}$ point exceeds the first dimensional threshold in order to identify a next seam line. The seam setting module 134 can continue to step through each line in the first index of lines in this manner until all of the seam lines are set in the first series of lines, i.e., until all lines in the first index of lines are analyzed.

In one embodiment, the seam setting module 134 iteratively sets lines in the second series of lines as seam lines in a second set of seam lines if a vertical distance between any point on a next line in the second series of lines and any point on a latest seam line in the second set of seam lines exceeds a second dimensional threshold. In another embodiment, the second dimensional threshold can be determined based on the material height. For example, in a further embodiment, the second dimensional threshold can be the material height minus a tolerance value.

In one embodiment, the seam setting module 134 can loop through the second index of lines and the second index of points to identify one or more points on each of the second series of lines having a minimum distance in the vertical direction ($Y_{min}$ point). In another embodiment, the seam setting module 134 can loop through the second index of lines and the second index of points to identify one or more points on each of the second series of lines having a maximum distance in the vertical direction ($Y_{max}$ point).

In one embodiment, the seam setting module 134 can set the first line in the second index of lines as a seam line. The seam setting module 134 can then move to a next line in the second index of lines to determine whether the vertical distance between the next line's $Y_{max}$ point to the latest seam line's $Y_{min}$ point exceeds the second dimensional threshold. If the next line's $Y_{max}$ point to the latest seam line's $Y_{min}$ point does not exceed the second dimensional threshold, then the seam setting module 134 can move to the next line in the second index of lines. This continues until it is determined that for a particular line in the second index of lines, the distance from the line's $Y_{max}$ point to the latest seam line's $Y_{min}$ point exceeds the second dimensional threshold. When this occurs, the seam setting module 134 can set the previous line in the second index of lines as a seam line. The new seam line can be added to the second index of seam lines, and the seam setting module 134 can step through the next lines in the second index of lines to determine whether the vertical distance between the next line's $Y_{max}$ point to the latest seam line's $Y_{min}$ point exceeds the second dimensional threshold in order to identify a next seam line. The seam setting module 134 can continue to step through each line in the second index of lines in this manner until all of the seam lines are set in the second series of lines, i.e., until all lines in the second index of lines are analyzed. These concepts will be described in greater detail below with reference to various example scenarios depicted in FIGS. 5A-D, 6A-D, and 7A-C.

In certain embodiments, drawn geometry (e.g., drawn curves/lines) can be included in the first or second index of lines such that drawn geometry lines can also be analyzed as potential seam lines.

Figure 4:
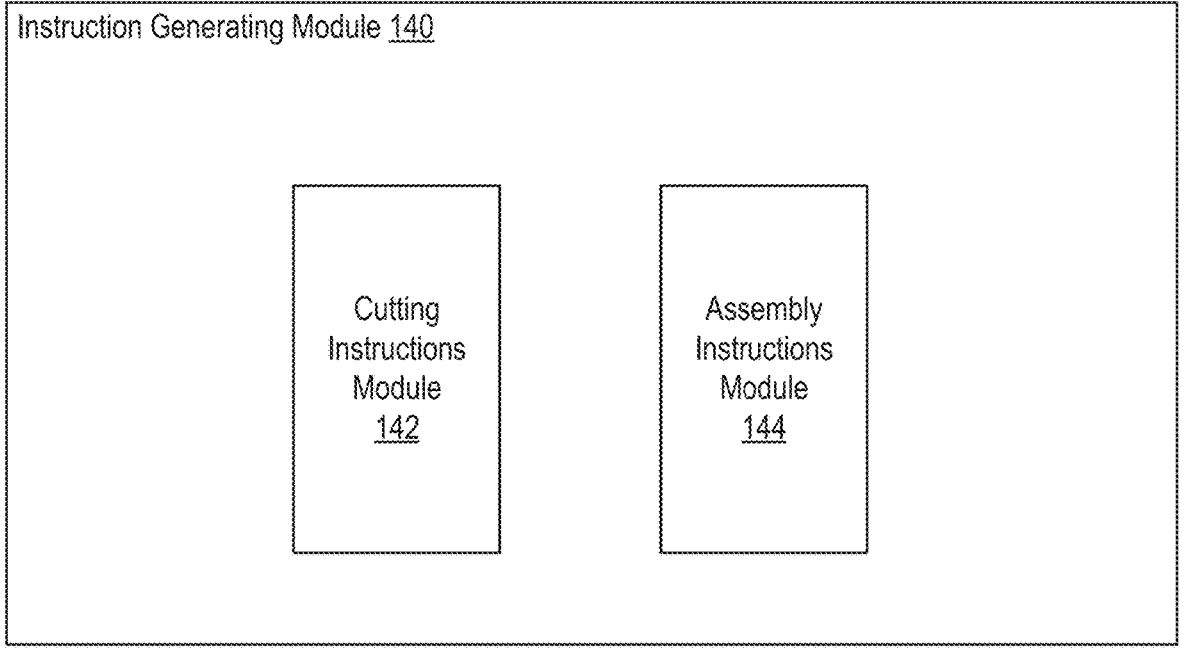
FIG. 4 illustrates an instruction generating module in accordance with one embodiment of the present disclosure.

FIG. 4 illustrates an instruction generating module 140 configured to generate instructions for cutting a plurality of surface material units into a plurality of three-dimensional segments and for assembling the plurality of three-dimensional segments on a building surface area to create a three-dimensional design, in accordance with one embodiment. As shown in FIG. 4, the instruction generating module 140 can include a cutting instructions module 142 and an assembly instructions module 144.

The cutting instructions module 142 can be configured to produce a set of computer-readable instructions that can be interpreted to extract the commands needed to operate a particular cutting machine for production of a plurality of three-dimensional segments. For example, the instructions can comprise Computer Numeric Control (CNC) instructions, such as G-code. As will be discussed in more detail below, the cutting instructions can be transmitted to a local CNC machine or to one or more CNC machines around the world.

In one embodiment, the cutting instructions module 142 can assign a number to each of the plurality of three-dimensional segments. In one embodiment, the cutting instruction module 142 can include with the computer readable instructions, instructions to cut the number assigned to each of the plurality of three-dimensional segments onto the back of the corresponding three-dimensional segment.

The assembly instructions module 144 can be configured to generate instructions for assembling the plurality of three-dimensional segments over a building surface to create a three-dimensional design. For example, in one embodiment, the assembly instructions module 144 can generate a drawing of the building surface area, with the plurality of numbered, three-dimensional segments arranged over the building surface area to create the three-dimensional design.

Figure 5A:
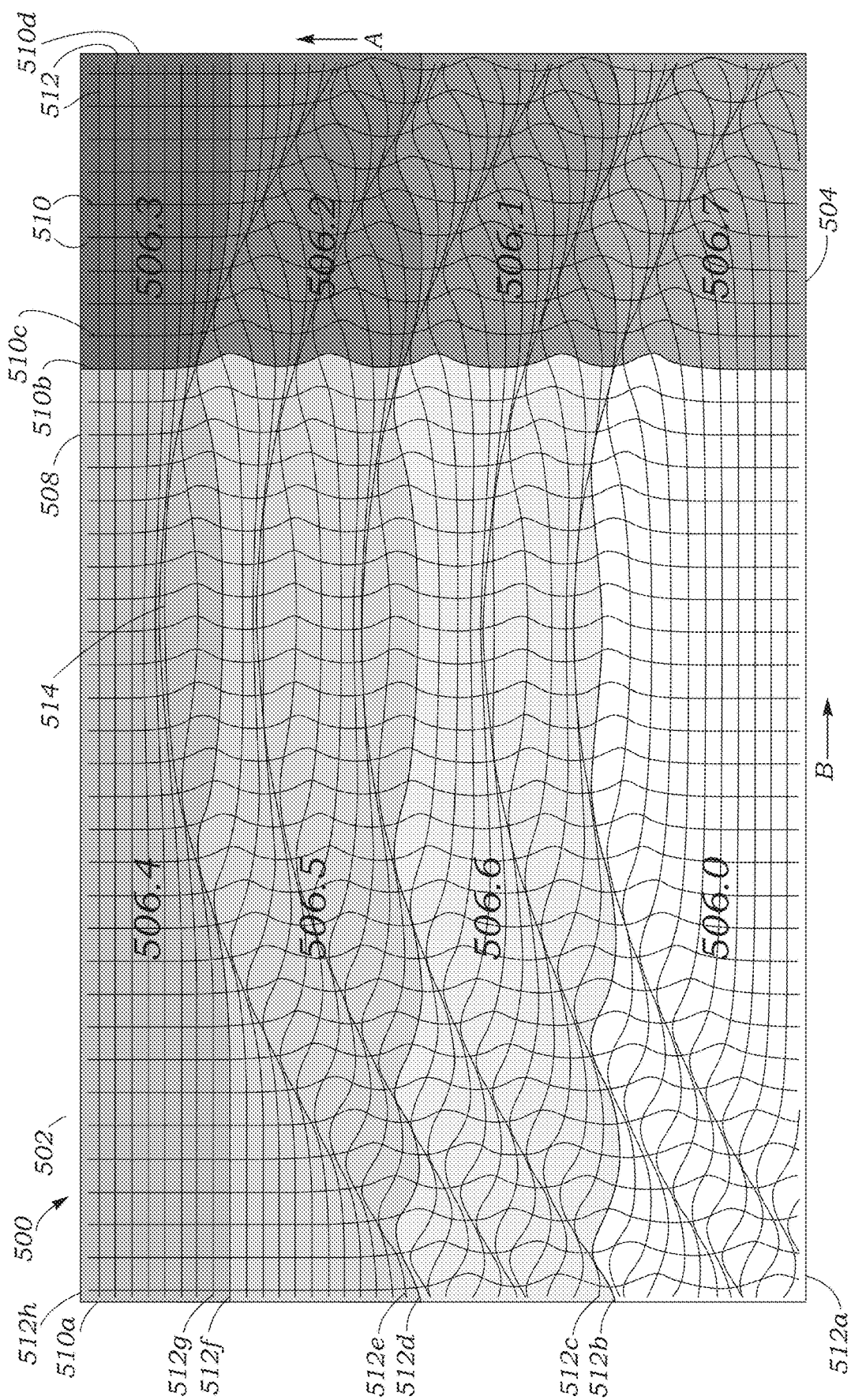
FIG. 5A illustrates a design page showing a rendering of a three-dimensional design over a building surface area in accordance with one embodiment of the present disclosure.

FIG. 5A provides an example scenario 500 associated with receiving dimensions and design parameters for a three-dimensional design 504 and partitioning the three-dimensional design into a plurality of three-dimensional segments 506.0-506.7, according to one embodiment. The example scenario 500 illustrates an interface 502. As shown in the example of FIG. 5A, the interface 502 can provide a display of the three-dimensional design 504 over a plurality of three-dimensional segments 506.0-506.7 arranged over a virtual building surface 508.

In this example scenario 500, the virtual building surface 508 has a surface length of 155 inches and a surface height of 90 inches. The plurality of three-dimensional segments 506.0-506.7 represent a plurality of surface material units, each with a starting material length of 120 inches and a starting material height of 30 inches, that have been cut and arranged over virtual building surface 508.

The three-dimensional design comprises a first series of lines 510 extending generally in a first direction A (in this case, vertically) and a second series of lines 512 extending generally in a second direction B (in this case, horizontally), where the first direction is different from the second direction. In this example, the density of the first series of lines is 4 inches per line and the density of the second series of lines is 2 inches per line.

In this example, the three-dimensional design further includes five arches 514 as additional drawn design elements or geometry. The attraction shape, which defines the radius of attraction between the first and second series of lines and the drawn geometry 514, is set in this example to 1 inch. The attraction intensity for the first series of lines, which defines the intensity of the attraction between points on the first series of lines and the drawn geometry, is set to 4; and the attraction intensity for the second series of lines, which defines the intensity of the attraction between points on the second series of lines and the drawn geometry, is set to 2.

In the example scenario 500, a left-most vertical line 510a is identified as a first seam line in a first set of seam lines. The construction module 110 automatically iterates through each vertical line 510, and analyzes whether the distance between a maximum X value on each vertical line 510 to a minimum X value on the first seam line 510a exceeds a horizontal threshold (e.g., 120 inches, the length of the surface material unit). In the example scenario 500, it has been determined that the horizontal distance between a maximum X value on a vertical line 510c and a minimum X value on the first seam line 510a exceeds the horizontal threshold. As such, the immediately preceding vertical line 510b is selected as a second seam line in the first set of seam lines. Repeating these steps, it is determined that there is no vertical line for which the distance to the second seam line 510b exceeds the horizontal threshold. As such, a rightmost vertical edge 510d is selected as a final seam line in the first set of seam lines.

Seam lines in the perpendicular direction can be selected in a similar manner. In the example scenario 500, a lower-most horizontal line 512a is selected as a first seam line in a second set of seam lines. The construction module 110 automatically iterates through each horizontal line 512 and determines whether the vertical distance between a maximum Y value on each horizontal line 512 and a minimum Y value on the first seam line 512 in the second set of seam lines exceeds a vertical threshold (e.g., 30 inches, the height of the surface material unit). In the example scenario 500, it is determined that the vertical distance between a maximum Y value on a horizontal line 512c and a minimum Y value on the first seam line 512a in the second set of seam lines exceeds the vertical threshold. As such, the immediately preceding horizontal line 512b is selected as a second seam line in the second set of seam lines. These steps are then repeated from the second seam line 512b in the second set of seam lines. It is determined that the vertical distance between a maximum Y value for a horizontal line 512e and a minimum Y value for the second seam line 512b in the second set of seam lines exceeds the vertical threshold. As such, the immediately preceding horizontal line 512d is selected as a third seam line in the second set of seam lines. These steps are repeated once again from the third seam line 512d in the second set of seam lines. Each horizontal line 512 from the third seam line 512d is analyzed to find the first horizontal line 512 for which the vertical distance between a maximum Y value on that horizontal line and a minimum Y value on the third seam line 512d in the second set of seam lines exceeds the vertical threshold. It is determined that that is true for horizontal line 512g. As such, the immediately preceding horizontal line 512f is selected as a fourth seam line in the second set of seam lines. Repeating these steps, it is determined that there is no horizontal line 512 that exceeds the vertical threshold from the fourth seam line 512f in the second set of seam lines. As such, an uppermost horizontal line 512g is selected as a final seam line in the second set of seam lines.

Figure 5B:
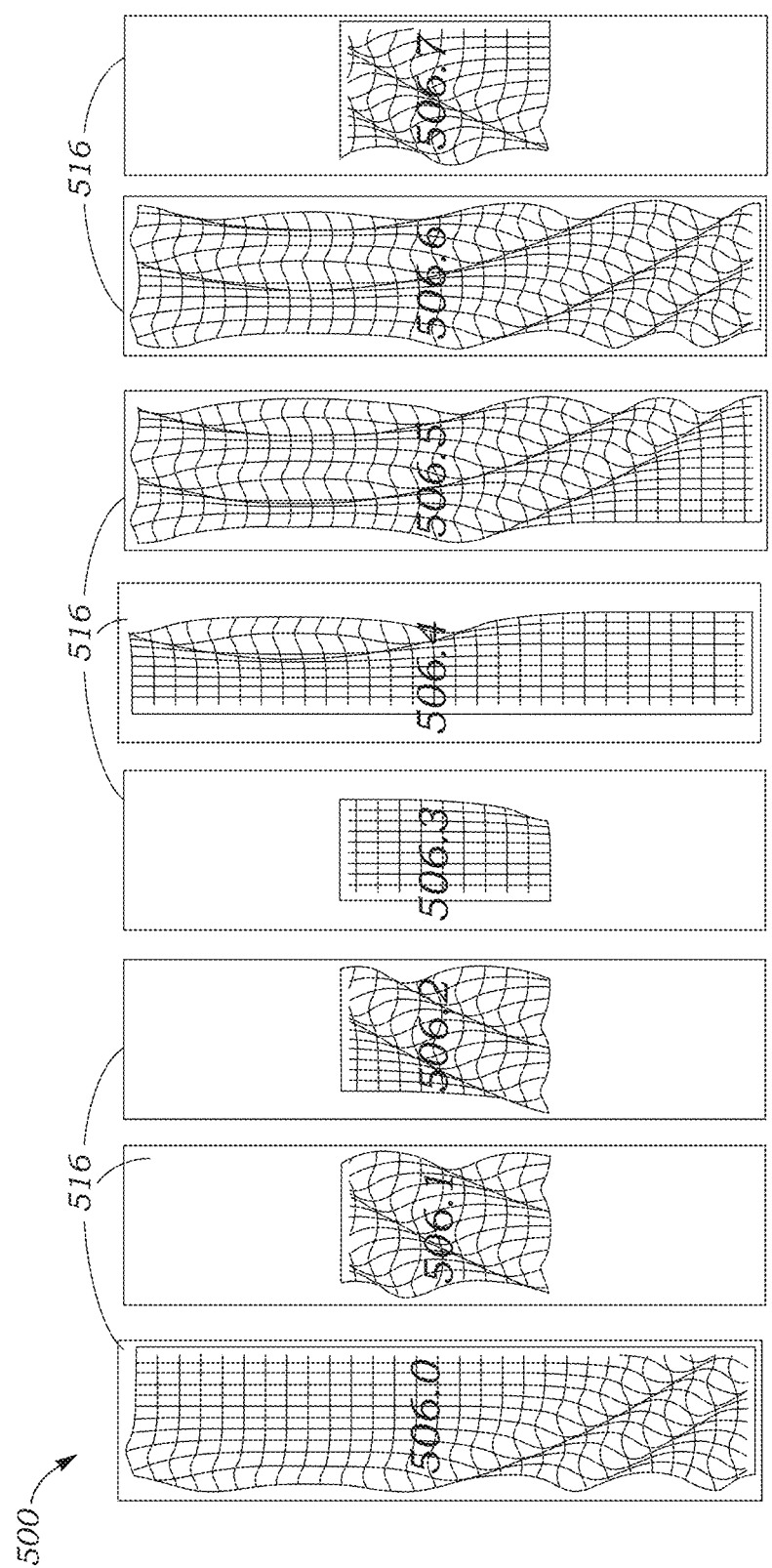
FIG. 5B illustrates a design page showing a rendering of a plurality of three-dimensional segments that can be arranged to form the three-dimensional design of FIG. 5A, in accordance with one embodiment of the present disclosure.

FIG. 5B provides an example scenario 500 associated with partitioning the three-dimensional design 504 shown in FIG. 5A into a plurality of three-dimensional segments 506.0-506.7 based on both the three-dimensional design 504 and the dimensions of the surface material units 516 and generating a set of milling instructions for cutting a plurality of surface material units 516 into the plurality of three-dimensional segments 506.0-506.7, according to one embodiment. The interface 502 reflects how the plurality of surface material units 516 should be cut to manufacture the plurality of three-dimensional segments 506.0-506.7.

In this example, the cutting instructions would be sent to a CNC milling machine, which would cut eight surface material units, each having a material length of 120 inches and a material height of 30 inches, as shown. In one embodiment, the eight units would be numbered and arranged on the building surface as shown in FIG. 5A.

FIG. 5C provides an example scenario 550 associated with receiving modified design parameters, according to one embodiment. The example scenario 550 illustrates an interface 552, similar to interface 502 of FIG. 5A. In the example scenario 550, the three-dimensional design 504 is not changed, but a horizontal offset has been changed from 0 inches to 10 inches. This change to the horizontal offset results in shifting the horizontal position of the plurality of three-dimensional segments 518.0-518.11 over the virtual building surface 508. In this example, the offset results in increasing the number of three-dimensional segments needed to cover the virtual building surface 508, as demonstrated by the vertical seam lines 570 and horizontal seam lines 572. The horizontal offset can be implemented in a variety of ways. For example, a leftmost first seam line can be offset by the horizontal offset, or the horizontal threshold for only the first iteration can be modified by the horizontal offset. It should be appreciated that a vertical offset can also be similarly implemented.

Figure 5D:
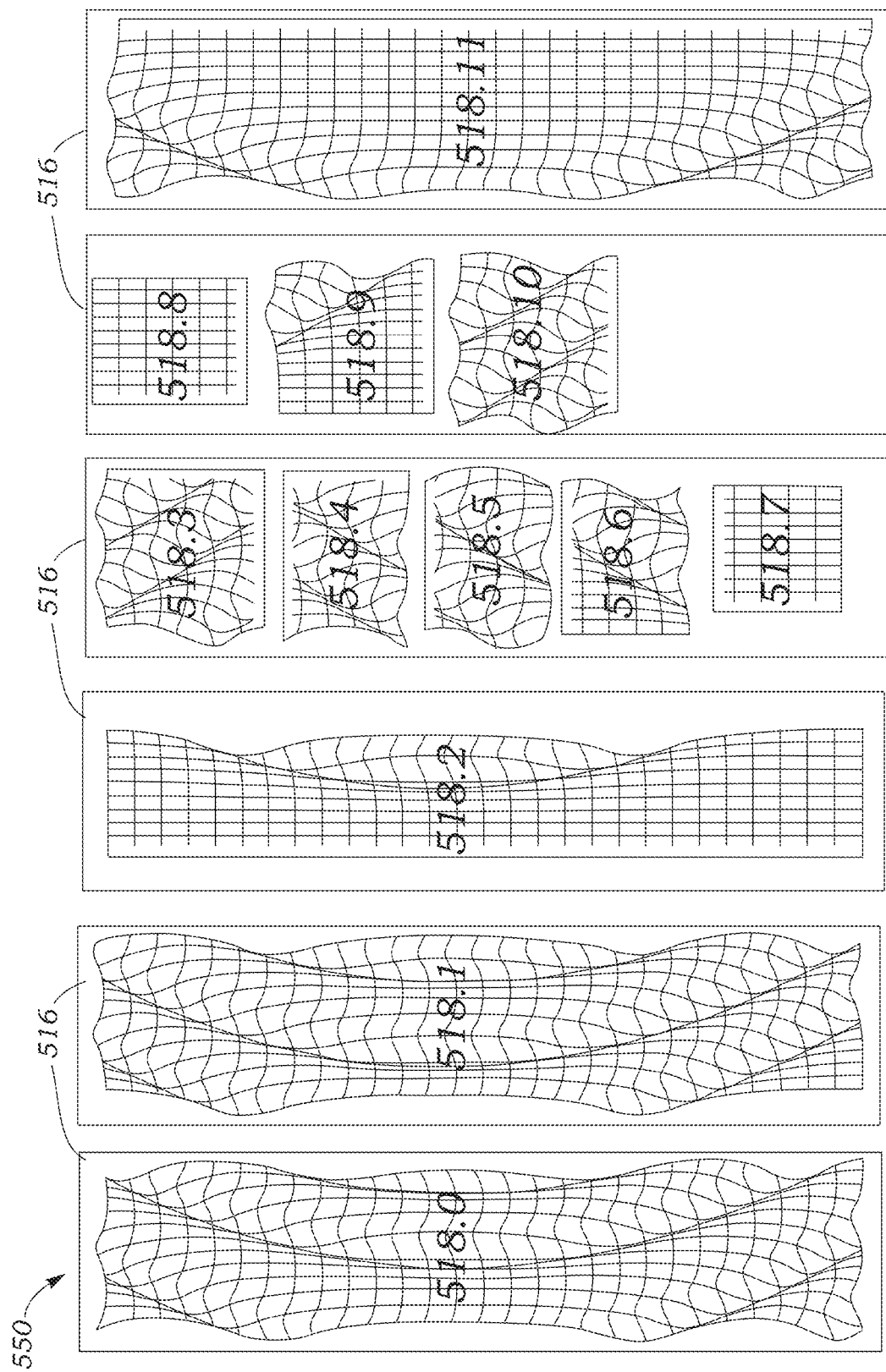
FIG. 5D illustrates a design page showing a rendering of a plurality of three-dimensional segments that can arranged to form the three-dimensional design of FIG. 5C, in accordance with one embodiment of the present disclosure.

FIG. 5D provides an example scenario 550 associated with partitioning the three-dimensional design 504 shown in FIG. 5C into a modified plurality of three-dimensional segments 518.0-518.11 and generating a set of milling instructions for cutting a plurality of surface material units 516 into the plurality of three-dimensional segments 518.0-518.11, according to one embodiment. The interface 552 reflects how the plurality of surface material units 516 should be cut to manufacture the plurality of three-dimensional segments 518.0-518.11.

In this example, the cutting instructions would be sent to a CNC milling machine, which would cut six surface material units 516, each having a material length of 120 inches and a material height of 30 inches, as shown. In one embodiment, the six units would be numbered and arranged on the building surface as shown in FIG. 5C.

Figure 6A:
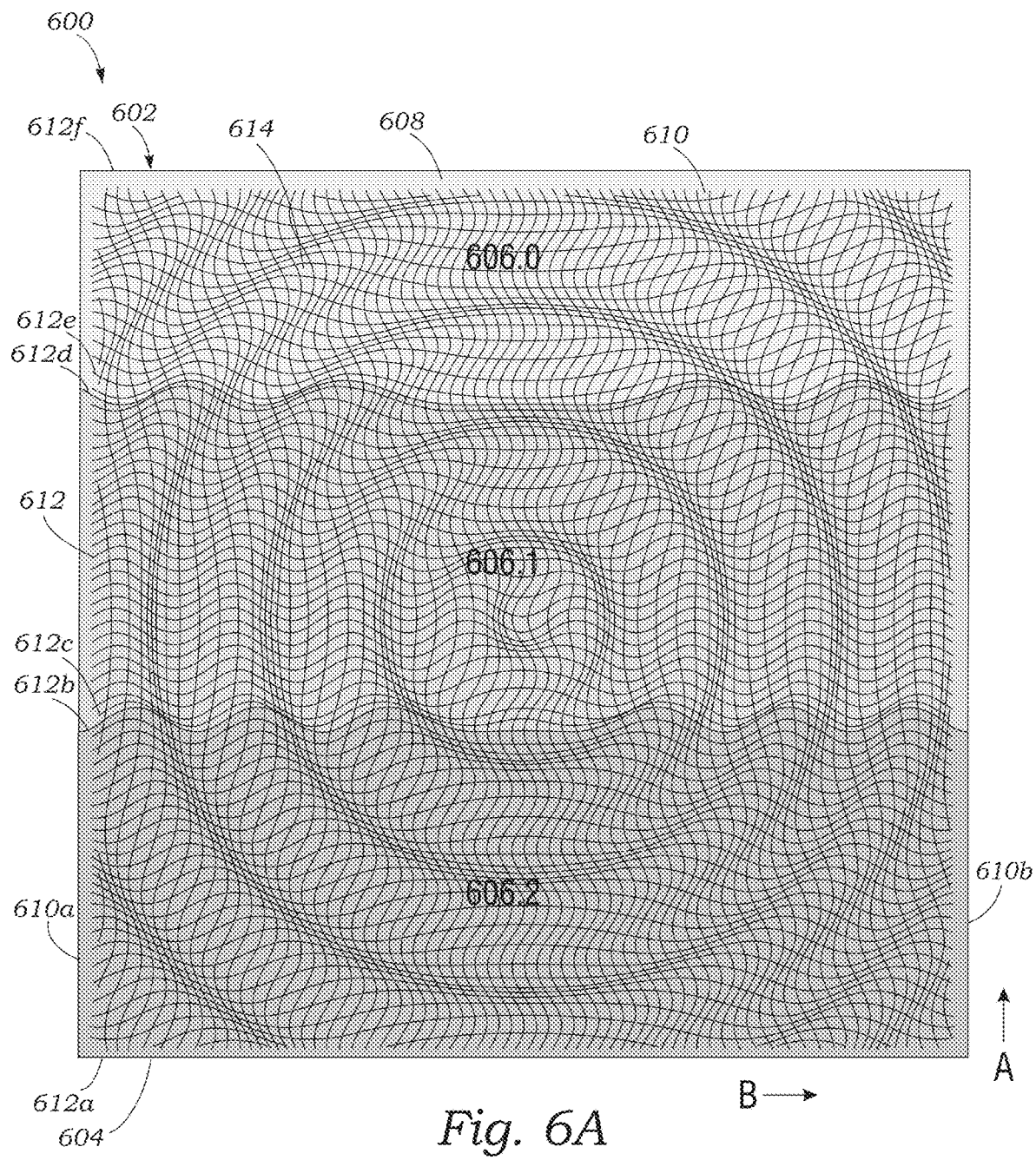
FIG. 6A illustrates a design page showing a rendering of a three-dimensional design over a building surface area in accordance with one embodiment of the present disclosure.

FIG. 6A provides an example scenario 600 associated with receiving dimensions and design parameters for a three-dimensional design 604 and partitioning the three-dimensional design into a plurality of three-dimensional segments 606.0-606.2, according to one embodiment. The example scenario 600 illustrates an interface 602. As shown in the example of FIG. 6A, the interface 602 can provide a display of the three-dimensional design 604 over a plurality of three-dimensional segments 606.0-606.2 arranged over a virtual building surface 608.

In this example scenario 600, the virtual building surface 608 has a surface length of 96 inches and a surface height of 96 inches. The plurality of three-dimensional segments 606.0-606.2 represent a plurality of surface material units, each with a starting material length of 96 inches and a starting material height of 30 inches, that have been cut and arranged over virtual building surface 608.

The three-dimensional design comprises a first series of lines 610 extending generally in a first direction A (in this case, vertically) and a second series of lines 612 extending generally in a second direction B (in this case, horizontally), where the first direction is different from the second direction. In this example, the density of the first series of lines is 1 inch per line and the density of the second series of lines is 0.5 inches per line.

In this example, a sine wave function was applied to the design to modify the position of points on the first and second series of lines 610, 612. More specifically, a sine shape value of 2.5 was applied to the first and second series of lines to add sinusoidal curved lines to the design. This results in a three-dimensional design comprising a series of ripples or concentric circles 614.

In the example scenario 600, a left-most vertical line 610a is identified as a first seam line in a first set of seam lines. The construction module 110 automatically iterates through each vertical line 610, and analyzes whether the distance between a maximum X value on each vertical line 610 to a minimum X value on the first seam line 610a exceeds a horizontal threshold (e.g., 96 inches, the length of the surface material unit). In the example scenario 600, there is no vertical line for which the distance to the first seam line 510a exceeds the horizontal threshold. As such, a rightmost vertical edge 610b is selected as a final seam line in the first set of seam lines.

It should be appreciated that, for examples like this one, where the length of the building surface is less than or equal to the length of the surface material, the three-dimensional design need not include a series of vertical lines. Similarly, where the width of the building surface is less than or equal to the width of the surface material, the three-dimensional design need not include a series of horizontal lines.

Seam lines in the perpendicular direction can be selected in a similar manner. In the example scenario 600, a lowermost horizontal line 612a is selected as a first seam line in a second set of seam lines. The construction module 110 automatically iterates through each horizontal line 612 and determines whether the vertical distance between a maximum Y value on each horizontal line 612 and a minimum Y value on the first seam line 612 in the second set of seam lines exceeds a vertical threshold (e.g., 30 inches, the height of the surface material unit). In the example scenario 600, it is determined that the vertical distance between a maximum Y value on a horizontal line 612c and a minimum Y value on the first seam line 612a in the second set of seam lines exceeds the vertical threshold. As such, the immediately preceding horizontal line 612b is selected as a second seam line in the second set of seam lines. These steps are then repeated from the second seam line 612b in the second set of seam lines. It is determined that the vertical distance between a maximum Y value for a horizontal line 612e and a minimum Y value for the second seam line 612b in the second set of seam lines exceeds the vertical threshold. As such, the immediately preceding horizontal line 612d is selected as a third seam line in the second set of seam lines. These steps are repeated once again from the third seam line 612d in the second set of seam lines. Repeating these steps, it is determined that there is no horizontal line 612 that exceeds the vertical threshold from the third seam line 612d in the second set of seam lines. As such, an uppermost horizontal line 612f is selected as a final seam line in the second set of seam lines.

Figure 6B:
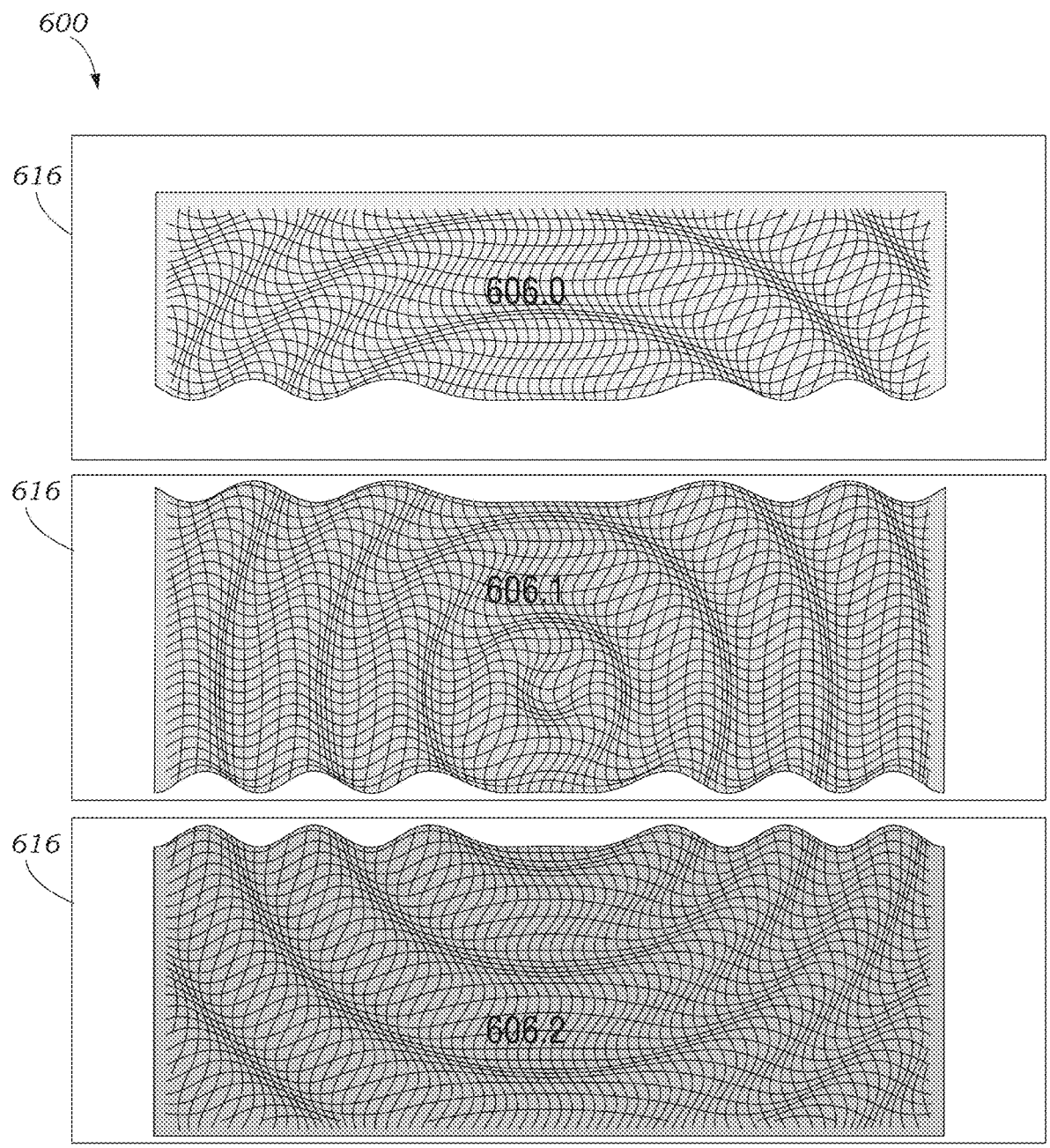
FIG. 6B illustrates a design page showing a rendering of a plurality of three-dimensional segments that can be arranged to form the three-dimensional design of FIG. 6A, in accordance with one embodiment of the present disclosure.

FIG. 6B provides an example scenario 600 associated with partitioning the three-dimensional design 604 shown in FIG. 6A into a plurality of three-dimensional segments 606.0-606.2 based on both the three-dimensional design 604 and the dimensions of the surface material units 616 and generating a set of milling instructions for cutting a plurality of surface material units 616 into the plurality of three-dimensional segments 606.0-606.2, according to one embodiment. The interface 602 reflects how the plurality of surface material units 616 should be cut to manufacture the plurality of three-dimensional segments 606.0-606.2.

In this example, the cutting instructions would be sent to a CNC milling machine, which would cut three surface material units, each having a material length of 96 inches and a material height of 30 inches, as shown. In one embodiment, the three units would be numbered and arranged on the building surface as shown in FIG. 6A.

Figure 6C:
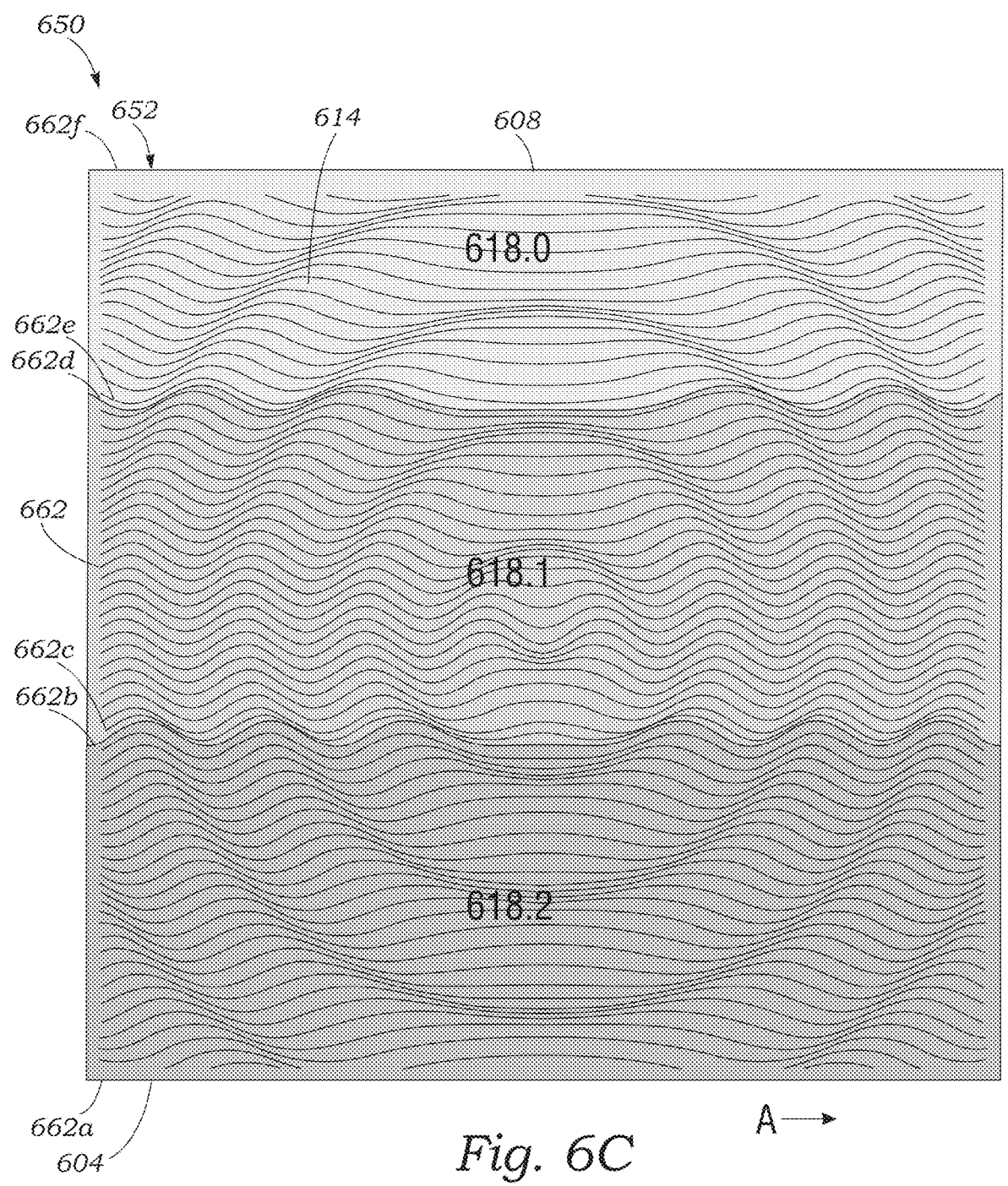
FIG. 6C illustrates a design page showing a rendering of a three-dimensional design over a building surface area in accordance with one embodiment of the present disclosure.

FIG. 6C provides an example scenario 650 associated with receiving modified design parameters, according to one embodiment. The example scenario 650 illustrates an interface 652, similar to interface 602 of FIG. 6A. In the example scenario 650, the three-dimensional design 604 is changed to comprise a first series of lines 662 extending generally in a first direction A (in this case, horizontally). Because the length of the building surface is less than or equal to the length of each of the surface material units, it is not necessary to include a second series of lines extending generally in a second direction, wherein the first direction is different from the second direction.

Seam lines can be selected as described above. For example, in the example scenario 650, a lowermost horizontal line 662a is selected as a first seam line in a first set of seam lines. The construction module 110 automatically iterates through each horizontal line 662 and determines whether the vertical distance between a maximum Y value on each horizontal line 662 and a minimum Y value on the first seam line 662 in the first set of seam lines exceeds a vertical threshold (e.g., 30 inches, the height of the surface material unit). In the example scenario 650, it is determined that the vertical distance between a maximum Y value on a horizontal line 662c and a minimum Y value on the first seam line 662a in the first set of seam lines exceeds the vertical threshold. As such, the immediately preceding horizontal line 662b is selected as a second seam line in the first set of seam lines. These steps are then repeated from the second seam line 662b in the first set of seam lines. It is determined that the vertical distance between a maximum Y value for a horizontal line 662e and a minimum Y value for the second seam line 662b in the first set of seam lines exceeds the vertical threshold. As such, the immediately preceding horizontal line 662d is selected as a third seam line in the first set of seam lines. These steps are repeated once again from the third seam line 662d in the first set of seam lines. Repeating these steps, it is determined that there is no horizontal line 662 that exceeds the vertical threshold from the third seam line 662d in the first set of seam lines. As such, an uppermost horizontal line 662f is selected as a final seam line in the first set of seam lines.

Figure 6D:
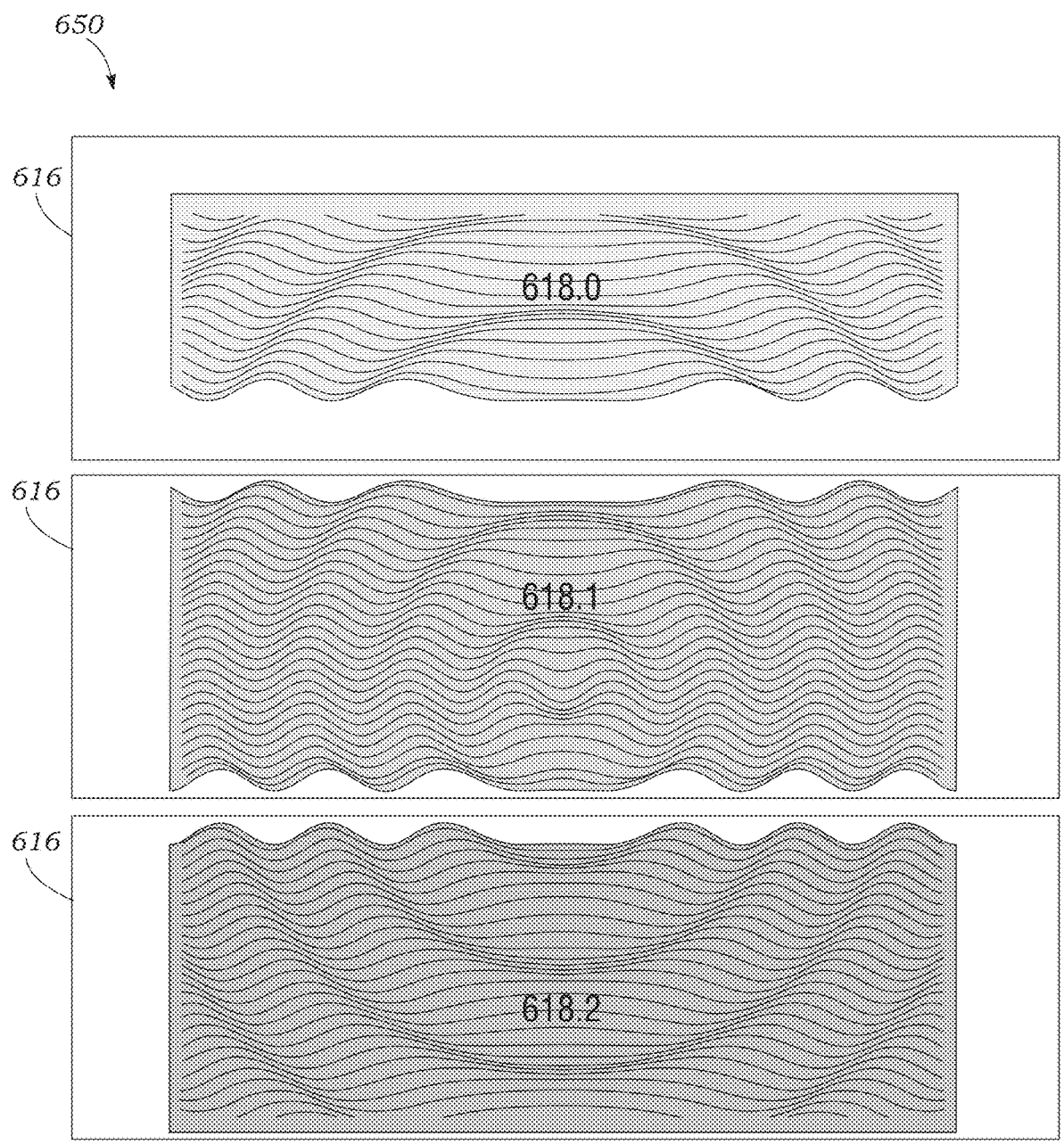
FIG. 6D illustrates a design page showing a rendering of a plurality of three-dimensional segments that can arranged to form the three-dimensional design of FIG. 6C, in accordance with one embodiment of the present disclosure.

FIG. 6D provides an example scenario 650 associated with partitioning the three-dimensional design 604 shown in FIG. 6C into a modified plurality of three-dimensional segments 618.0-618.2 and generating a set of milling instructions for cutting a plurality of surface material units 616 into the plurality of three-dimensional segments 618.0-618.2, according to one embodiment. The interface 652 reflects how the plurality of surface material units 616 should be cut to manufacture the plurality of three-dimensional segments 618.0-618.2.

In this example, the cutting instructions would be sent to a CNC milling machine, which would cut three surface material units 616, each having a material length of 96 inches and a material height of 30 inches, as shown. In one embodiment, the three units would be numbered and arranged on the building surface as shown in FIG. 6C.

Figure 7A:
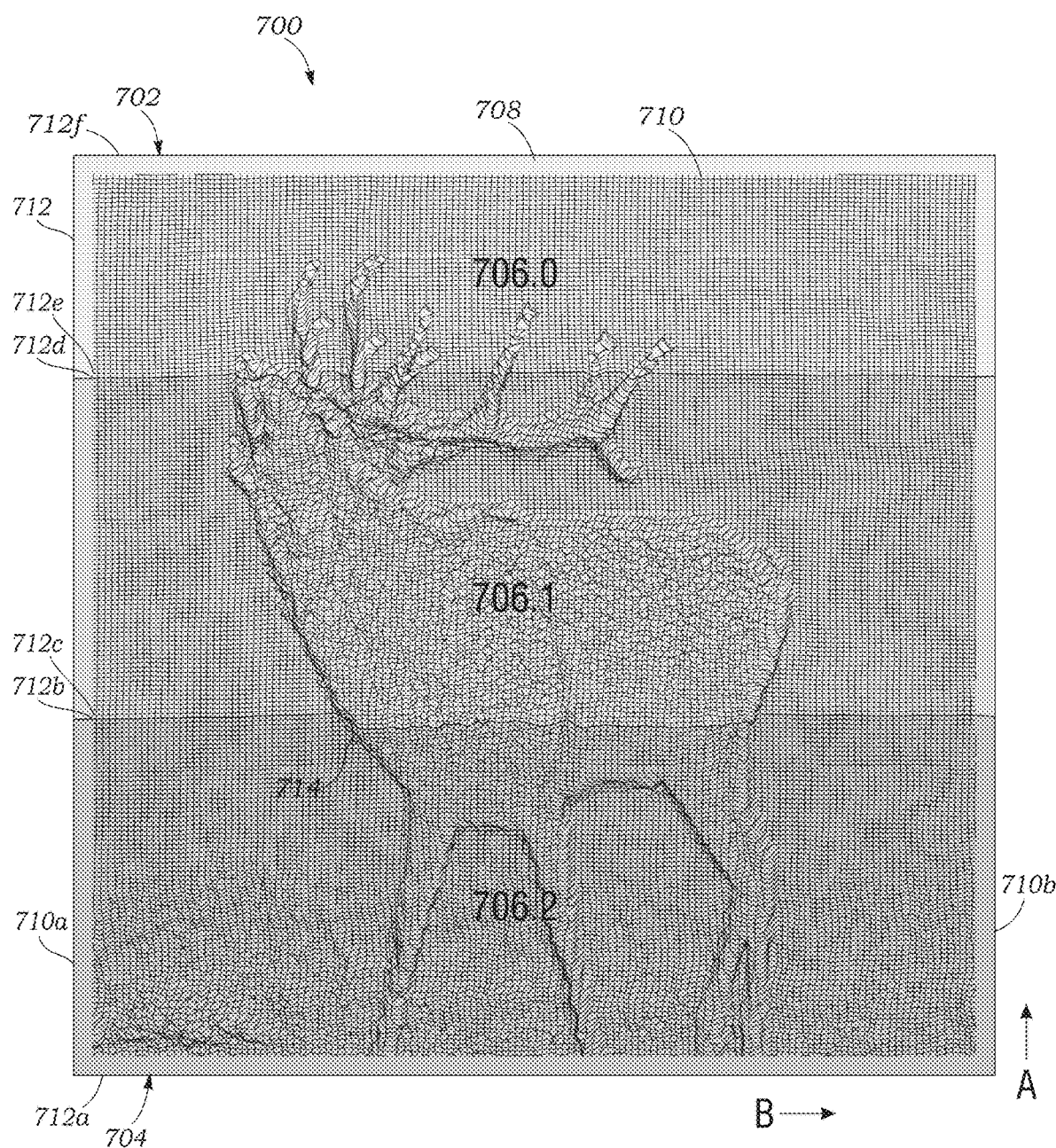
FIG. 7A illustrates a design page showing a rendering of a three-dimensional design over a building surface area in accordance with one embodiment of the present disclosure.

FIG. 7A provides an example scenario 700 associated with receiving dimensions and design parameters for a three-dimensional design 704 and partitioning the three-dimensional design into a plurality of three-dimensional segments 706.0-706.2, according to one embodiment. The example scenario 700 illustrates an interface 702. As shown in the example of FIG. 7A, the interface 702 can provide a display of the three-dimensional design 704 over a plurality of three-dimensional segments 706.0-706.2 arranged over a virtual building surface 708.

In this example scenario 700, the virtual building surface 708 has a surface length of 96 inches and a surface height of 96 inches. The plurality of three-dimensional segments 706.0-706.2 represent a plurality of surface material units, each with a starting material length of 96 inches and a starting material height of 30 inches, that have been cut and arranged over virtual building surface 708.

The three-dimensional design comprises a first series of lines 710 extending generally in a first direction A (in this case, vertically) and a second series of lines 712 extending generally in a second direction B (in this case, horizontally), where the first direction is different from the second direction. In this example, the density of the first series of lines is 1 inch per line and the density of the second series of lines is 0.5 inches per line.

Figure 7B:
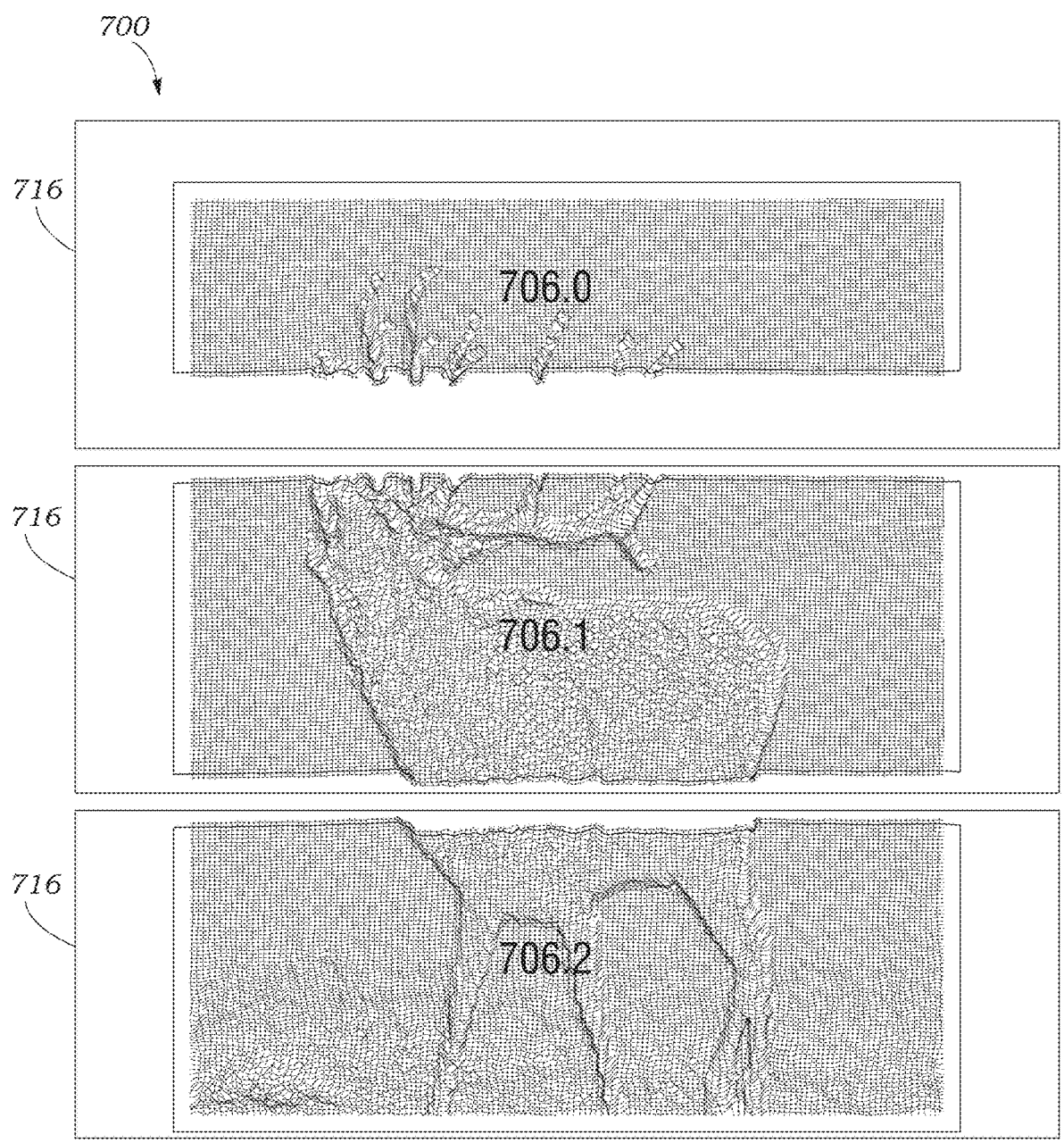
FIG. 7B illustrates a design page showing a rendering of a plurality of three-dimensional segments that can be arranged to form the three-dimensional design of FIG. 7A, in accordance with one embodiment of the present disclosure.
Figure 7C:
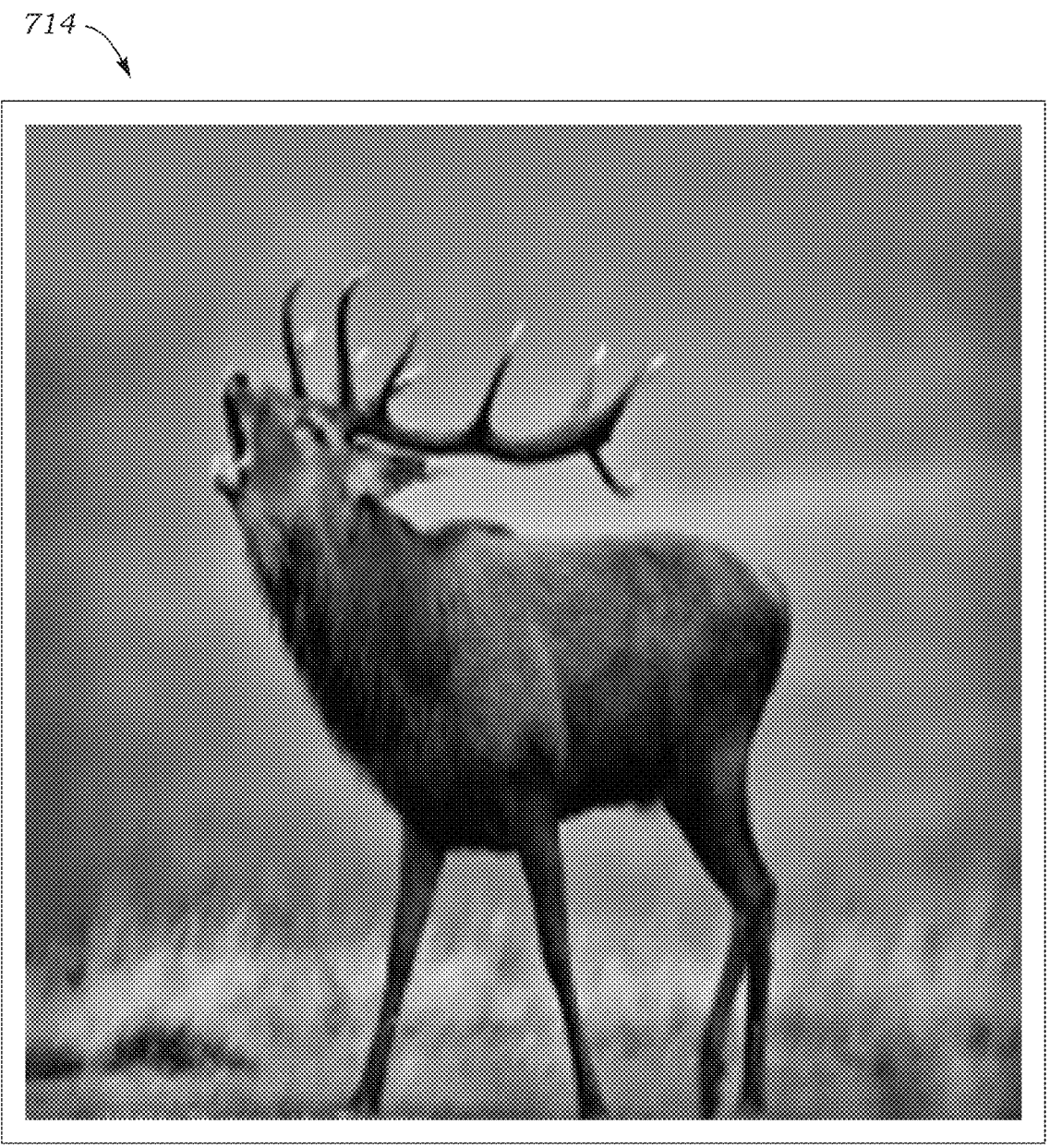
FIG. 7C illustrates an original image of a moose, which is used as an image element in the three-dimensional design of FIG. 7A, in accordance with one embodiment of the present disclosure.

With continued reference to FIG. 7A and also to FIG. 7C, in this example, the three-dimensional design further includes an image of a moose 714 as additional image element. The attraction intensity for the first series of lines, which defines the intensity of the attraction between points on the first series of lines and dark (or light) regions of the image element, is set to 1; and the attraction intensity for the second series of lines, which defines the intensity of the attraction between points on the second series of lines and dark (or light) regions of the image element, is set to 1.

In the example scenario 700, a left-most vertical line 710a is identified as a first seam line in a first set of seam lines. The construction module 110 automatically iterates through each vertical line 710, and analyzes whether the distance between a maximum X value on each vertical line 710 to a minimum X value on the first seam line 710a exceeds a horizontal threshold (e.g., 96 inches, the length of the surface material unit). In the example scenario 700, there is no vertical line for which the distance to the first seam line 710a exceeds the horizontal threshold. As such, a rightmost vertical edge 710b is selected as a final seam line in the first set of seam lines.

Seam lines in the perpendicular direction can be selected in a similar manner. In the example scenario 700, a lowermost horizontal line 712a is selected as a first seam line in a second set of seam lines. The construction module 110 automatically iterates through each horizontal line 712 and determines whether the vertical distance between a maximum Y value on each horizontal line 712 and a minimum Y value on the first seam line 712 in the second set of seam lines exceeds a vertical threshold (e.g., 30 inches, the height of the surface material unit). In the example scenario 700, it is determined that the vertical distance between a maximum Y value on a horizontal line 712c and a minimum Y value on the first seam line 712a in the second set of seam lines exceeds the vertical threshold. As such, the immediately preceding horizontal line 712b is selected as a second seam line in the second set of seam lines. These steps are then repeated from the second seam line 712b in the second set of seam lines. It is determined that the vertical distance between a maximum Y value for a horizontal line 712e and a minimum Y value for the second seam line 712b in the second set of seam lines exceeds the vertical threshold. As such, the immediately preceding horizontal line 712d is selected as a third seam line in the second set of seam lines. These steps are repeated once again from the third seam line 712d in the second set of seam lines. Each horizontal line 712 from the third seam line 712d is analyzed to find the first horizontal line 712 for which the vertical distance between a maximum Y value on that horizontal line and a minimum Y value on the third seam line 712d in the second set of seam lines exceeds the vertical threshold. It is determined that there is no horizontal line 712 that exceeds the vertical threshold from the third seam line 712d in the second set of seam lines. As such, an uppermost horizontal line 712f is selected as a final seam line in the second set of seam lines.

FIG. 7B provides an example scenario 700 associated with partitioning the three-dimensional design 704 shown in FIG. 7A into a plurality of three-dimensional segments 706.0-706.2 based on both the three-dimensional design 704 and the dimensions of the surface material units 716 and generating a set of milling instructions for cutting a plurality of surface material units 716 into the plurality of three-dimensional segments 706.0-706.2, according to one embodiment. The interface 702 reflects how the plurality of surface material units 716 should be cut to manufacture the plurality of three-dimensional segments 706.0-706.2.

In this example, the cutting instructions would be sent to a CNC milling machine, which would cut three surface material units, each having a material length of 96 inches and a material height of 30 inches, as shown. In one embodiment, the three units would be numbered and arranged on the building surface as shown in FIG. 7A.

Figure 11A:
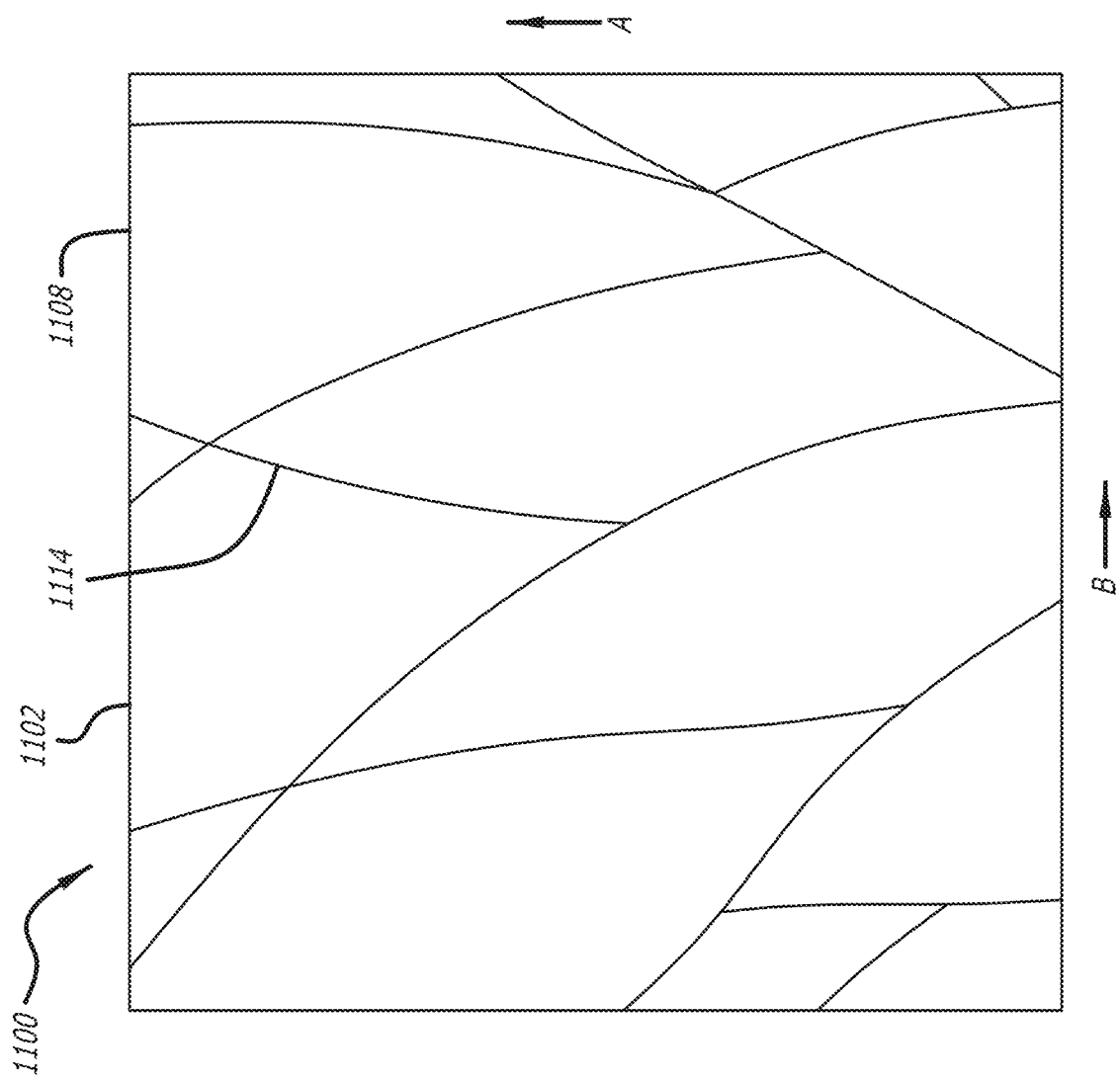
FIG. 11A illustrates a design page showing drawn design elements over a building surface area in accordance with one embodiment of the present disclosure.

FIG. 11A provides an example scenario 1100 associated with receiving design parameters for a three-dimensional design according to one embodiment. The example scenario 1100 illustrates an interface 1102. In this example, the design parameters comprise a drawn design 1114 that includes several pedal-like segments. As shown in the example of FIG. 7A, the interface 1102 can provide a display of the drawn design 1114 over a virtual building surface 1108.

Figure 11B:
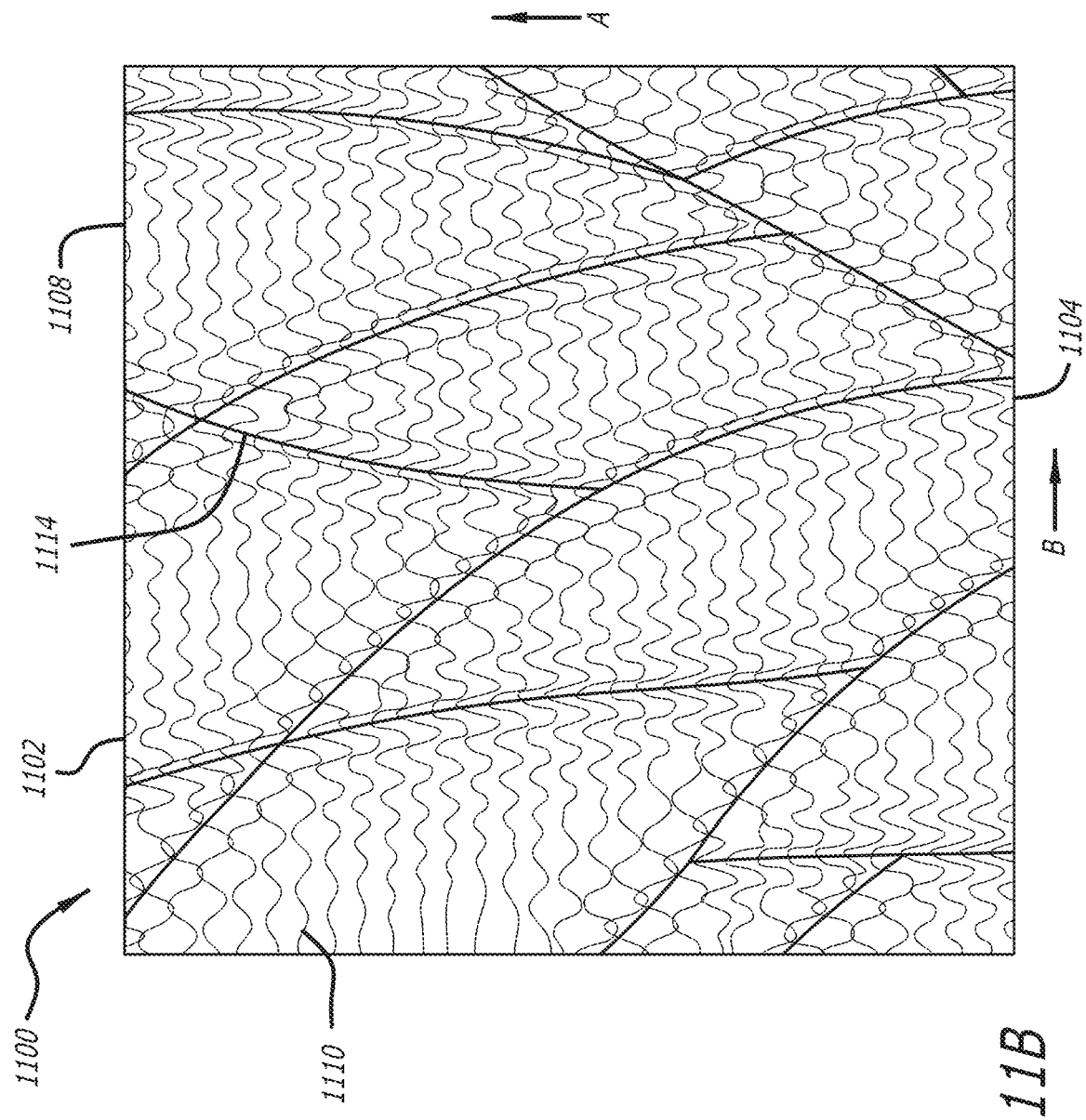
FIG. 11B illustrates a rendering of a first three-dimensional design over the drawn design elements of the building surface area shown in FIG. 11A.

With reference to FIG. 11B, the received design parameters can further comprise a selected design-style, or "brushstroke." As discussed above, the system can include a plurality of brushstrokes, and each brushstroke can comprise predefined values for various shape parameters. In this scenario 1100, the selected brushstroke includes shape parameters for a first series of lines 1110 extending generally in a first direction B (in this case, horizontally). More specifically, the selected brushstroke specifies that the three-dimensional design 1104 includes horizontal lines 1110 (but not vertical lines), the line density is 1.60 inches, the point resolution is 0.50, the radius-of-attraction is 0.20, the attraction intensity is 2.00, the minimum depth is 0.10, the maximum depth is 0.35, the frequency of a periodic function applied to the lines is 3.00, and the line thickness is 2.00. These predefined shape parameters cause a series of horizontal lines 1110 to interact with the drawn design 1114 to create the frenetic and wild three-dimensional design 1104 shown in FIG. 11B. If this brushstroke were applied to an image element or to a different drawn design, the resulting three-dimensional design would be unique, but it would have the same turbulent style.

Figure 11C:
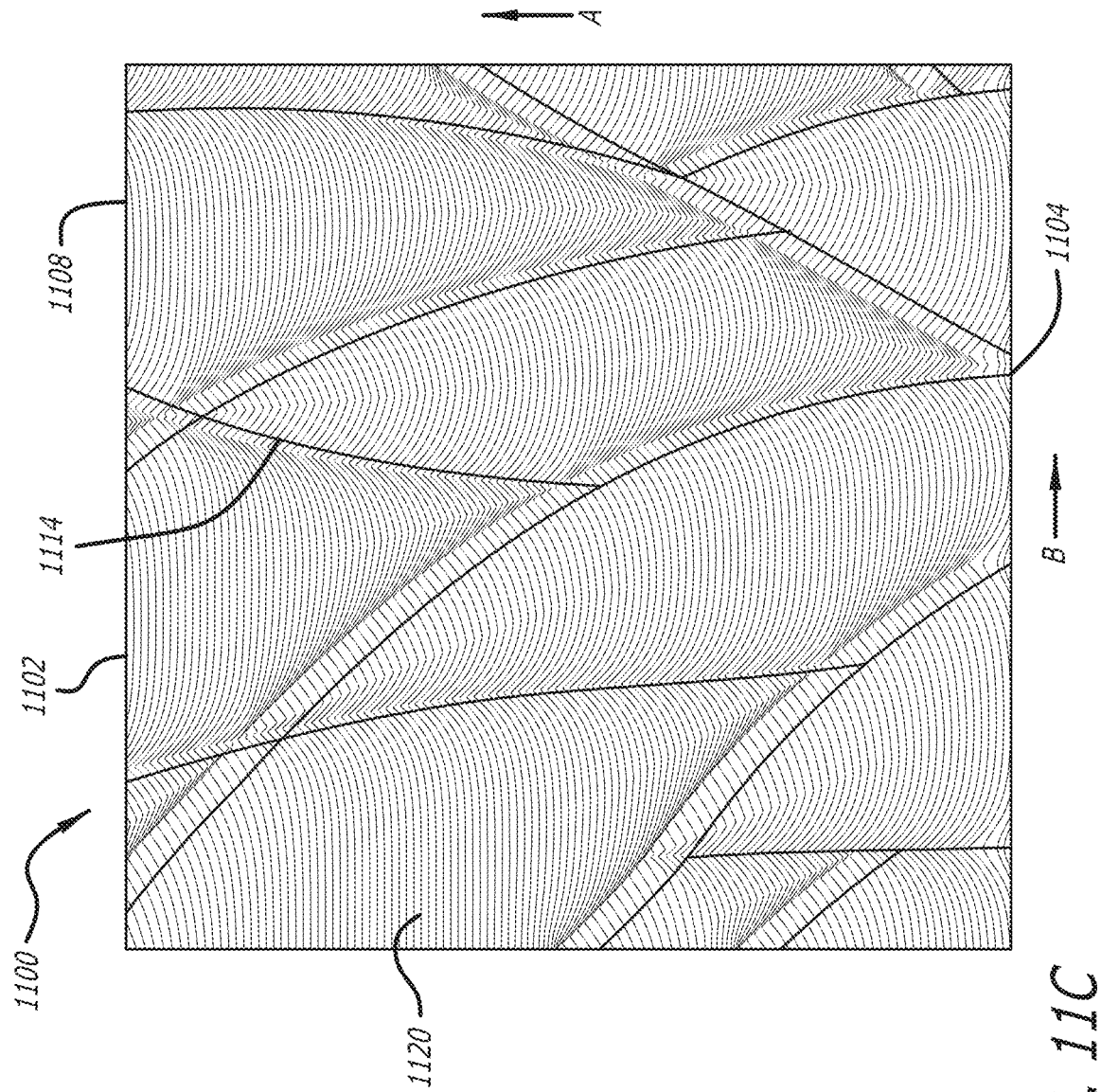
FIG. 11C illustrates a rendering of a second three-dimensional design over the drawn design elements of the building surface area shown in FIG. 11A.

FIG. 11C illustrates how the style of the three-dimensional design is changed when a different brushstroke is applied to the same design element 1114 (in this case, a drawn element). In this example, the same design element 1114 is used, but a different brushstroke is selected. This alternative brushstroke specifies that the three-dimensional design 1104 includes horizontal lines 1120 (but not vertical lines), the line density is 0.40 inches, the point resolution is 0.10, the radius-of-attraction is 0.50, the attraction intensity is 1.00, the minimum depth is 0.20, the maximum depth is 0.35, the frequency of a periodic function applied to the lines is 0.25, and the line thickness is 1.00. These predefined shape parameters cause a series of horizontal lines 1120 to interact with the drawn design 1114 to create the neat and ordered three-dimensional design 1104 shown in FIG. 11C. If this brushstroke were applied to an image element or to a different drawn design, the resulting three-dimensional design would be unique, but it would have the tidy style.

The user can continue to alternate between the predefined brushstrokes until satisfied with the resulting three-dimensional design 1104. In some embodiments, the user can then hide the design element 1114 so that only the three-dimensional design 1104 is shown in the final product. Once the design is finalized, the system will partition the three-dimensional design into a plurality of three-dimensional segments and generate a set of milling instructions for cutting a plurality of surface material units into the plurality of three-dimensional segments, as described above.

Figure 8:
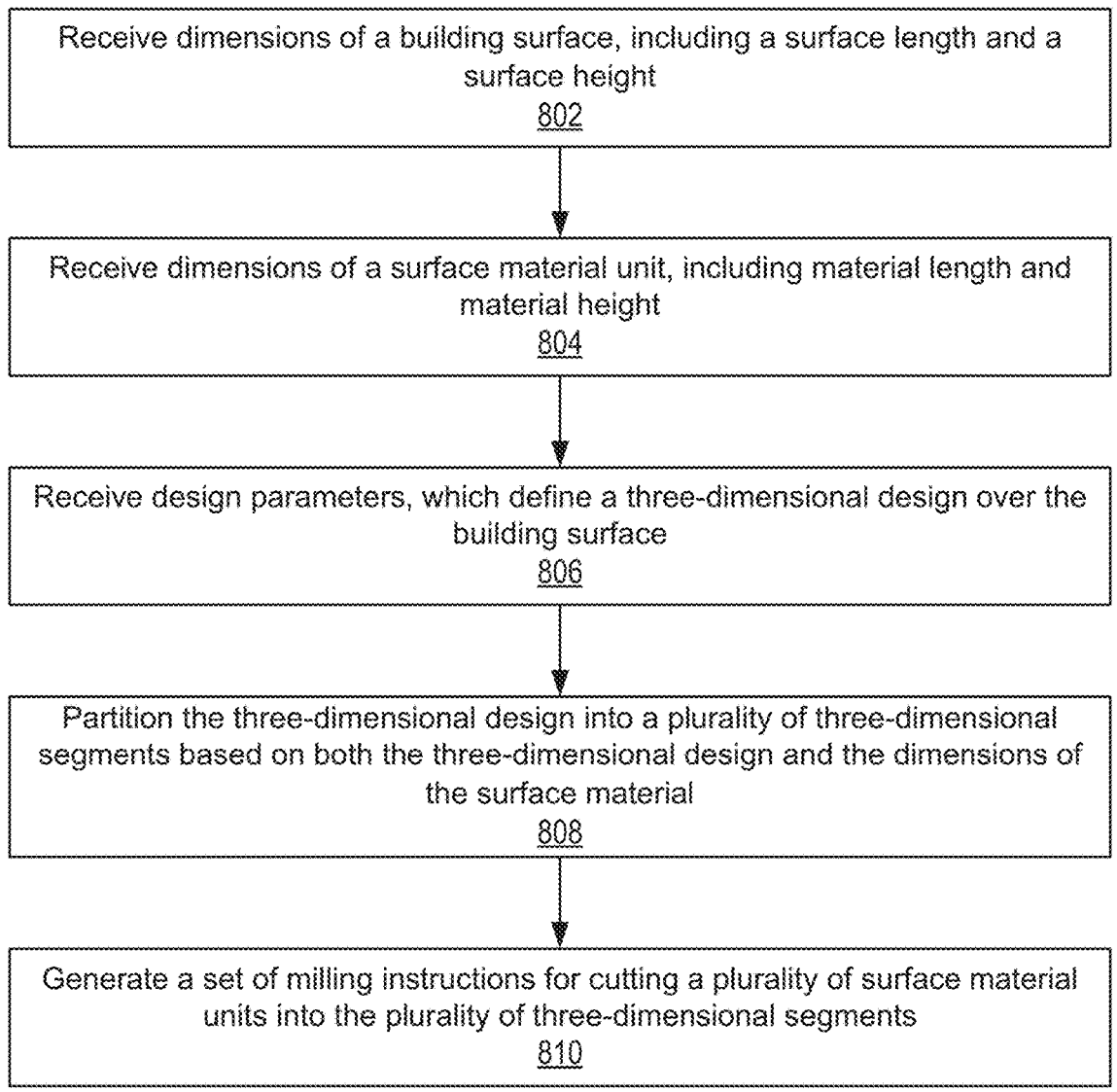
FIG. 8 illustrates a network diagram of an example system including a user device and a Computer Numeric Control (CNC) system that can be utilized in various scenarios, in accordance with one embodiment of the present disclosure.

FIG. 8 illustrates an example method 800 associated with manufacturing a three-dimensional building surface, according to one embodiment. It should be appreciated that, unless otherwise stated, the method can include additional, fewer, or alternative steps performed in similar, parallel, or alternative orders.

At block 802, the example method 800 can receive dimensions of a building surface, including a surface length and a surface height. At block 804, the example method 800 can receive dimensions of a surface material unit, including a material length and a material height. At block 806, the example method 800 can receive design parameters, which define a three-dimensional design over the building surface. At block 808, the example method 800 can partition the three-dimensional design into a plurality of three-dimensional segments based on both the three-dimensional design and the dimensions of the surface material. At block 810, the example method 800 can generate a set of milling instructions for cutting a plurality of surface material units into the plurality of three-dimensional segments.

Construction System—Example Implementation

Figure 9:
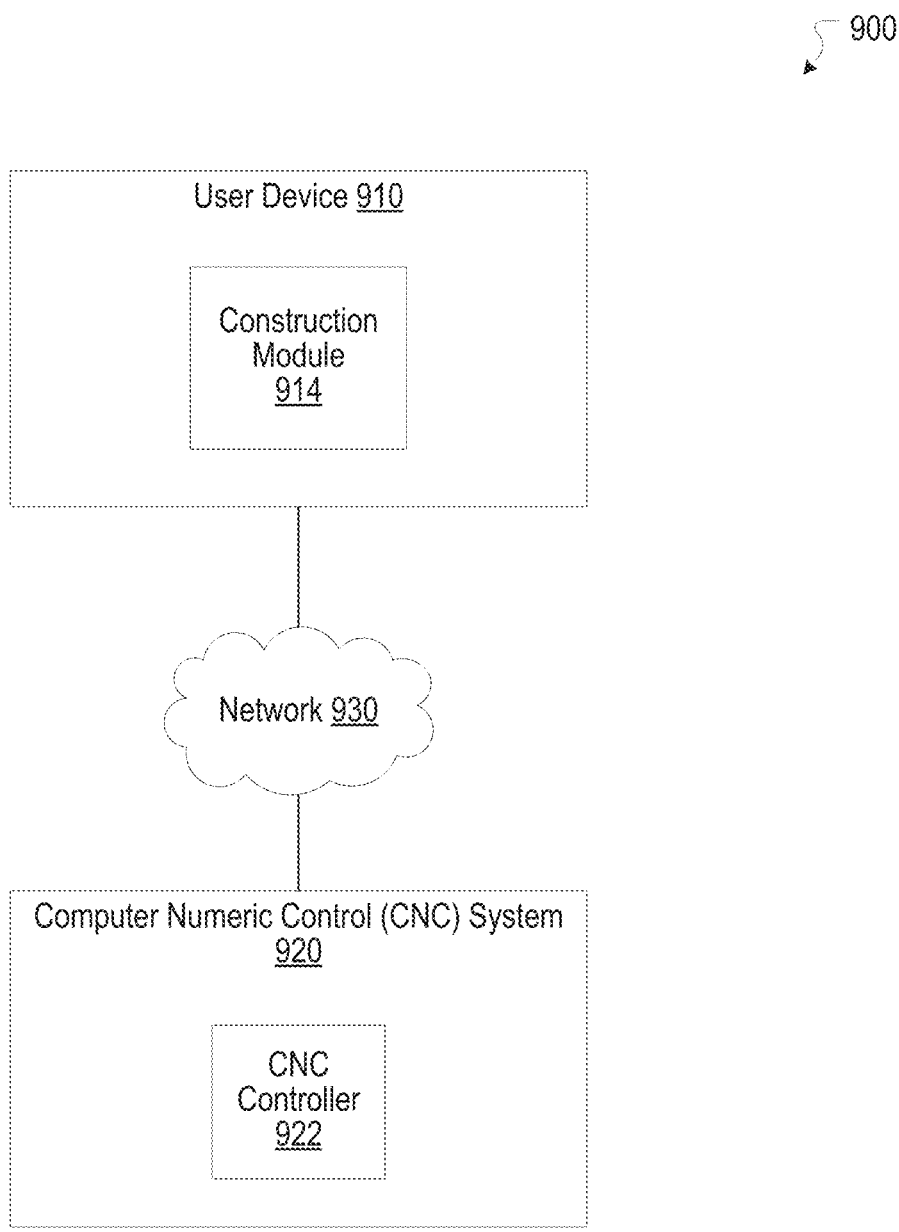
FIG. 9 illustrates an example method of manufacturing a building surface in accordance with one embodiment of the present disclosure.

FIG. 9 illustrates a network diagram of an example system 900 that can be used in various scenarios, in accordance with one embodiment. The system 900 can include one or more user devices 910, one or more CNC systems 920, and a network 930. For purposes of illustration, the embodiment of the system 900, shown by FIG. 9, includes a single user device 910 and a single CNC system 920. However, in other embodiments, the system 900 can include more user devices 910, CNC systems 920, or both.

The user device 910 comprises one or more computing devices (or systems) that can receive input from a user and transmit and receive data via the network 930. In one embodiment, the user device 910 is a conventional computer system executing, for example, a Microsoft Windows compatible operating system (OS), Apple OS X, or a Linux distribution. In another embodiment, the user device 910 can be a computing device or a device having computer functionality, such as a smart-phone, a tablet, a personal digital assistant (PDA), a mobile telephone, a laptop computer, a wearable device (e.g., a pair of glasses, a watch, a bracelet, etc.), a camera, an appliance, etc. The user device 910 is configured to communicate via the network 930.

In one embodiment, the user device 910 can include a construction module 914. In one embodiment, the construction module 914 can be implemented as the construction module 110 of FIG. 1. As discussed previously, it should be appreciated that there can be many variations or other possibilities. For example, in some instances, the construction module 914 (or at least a portion it, for example, the cutting module 150) can be included or implemented in the CNC system 920.

The user device 910 can be configured to communicate with the CNC system 920 via the network 930, which can comprise any combination of local area or wide area networks, using wired or wireless communication systems.

In one embodiment, the network 930 uses standard communications technologies and protocols. Thus, the network 930 can include links using technologies such as Ethernet, 802.11, worldwide interoperability for microwave access (WiMAX), 3G, 4G, CDMA, GSM, LTE, digital subscriber line (DSL), etc. Similarly, the networking protocols used on the network 930 can include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and the like. The data exchanged over the network 930 can be represented using technologies or formats including hypertext markup language (HTML) and extensible markup language (XML). In addition, all or some links can be encrypted using conventional encryption technologies such as secure sockets layer (SSL), transport layer security (TLS), and Internet Protocol security (IPsec).

In one embodiment, the CNC system 920 can include one or more CNC controllers 922 that process instructions to control the CNC system 920. In another embodiment, the instructions can be communicated from the user device 910 to the CNC system 920 using the network 930.

Hardware Implementation

Figure 10:
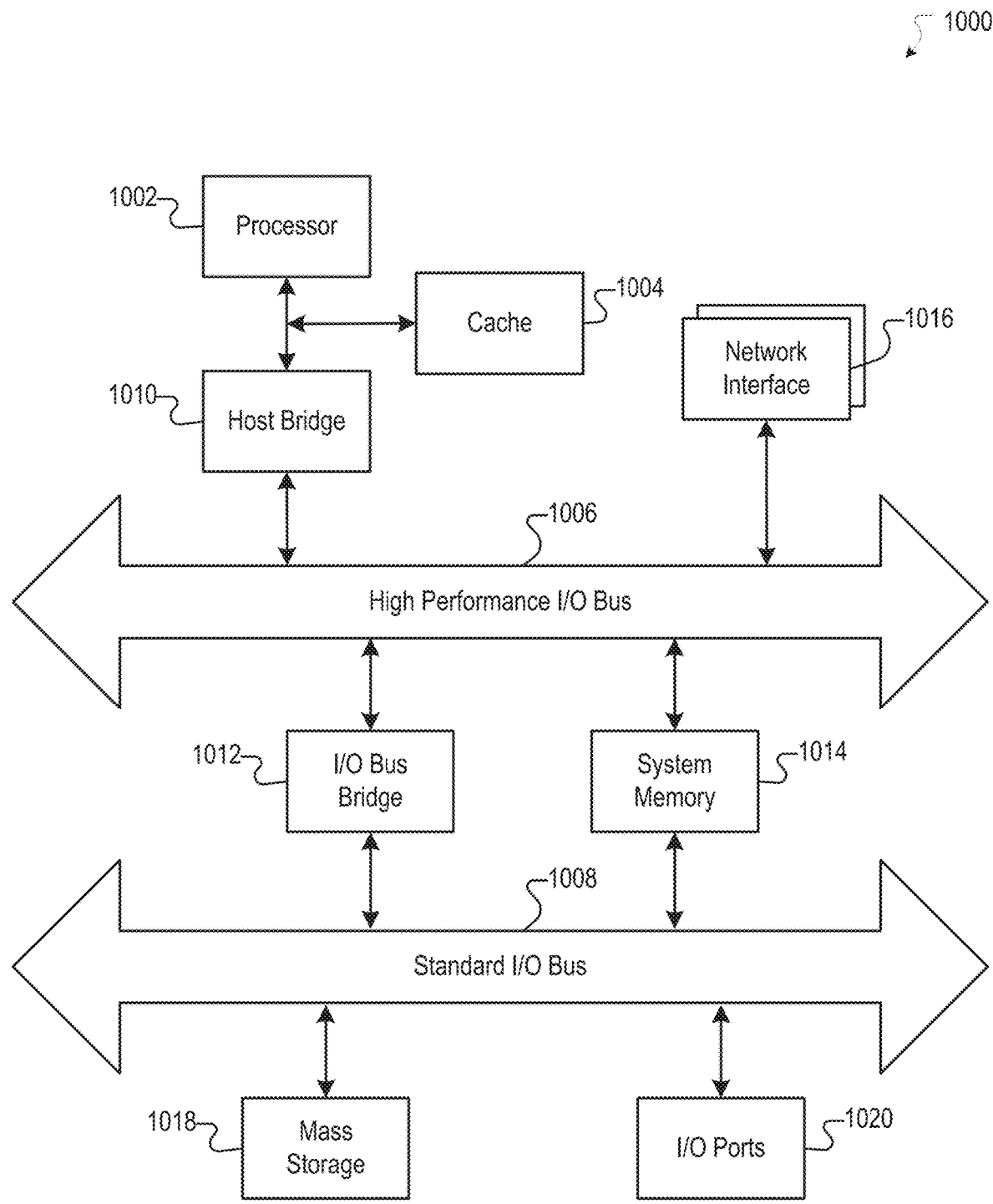
FIG. 10 illustrates an example of a computer system or computing device that can be used in various scenarios, in accordance with one embodiment of the present disclosure.

The described methods can be implemented by a wide variety of machine and computer system architectures and in a wide variety of network and computing environments. FIG. 10 illustrates an example of a computer system 1000 that can be used to implement one or more of the described embodiments. The computer system 1000 includes sets of instructions for causing the computer system 1000 to perform the described processes. The computer system 1000 can be connected (e.g., networked) to other machines. In a networked deployment, the computer system 1000 can operate in the capacity of a server machine or a client machine in a client-server network environment, or as a peer machine in a peer-to-peer (or distributed) network environment. In one embodiment, the computer system 1000 can be the user device 910, the CAD system 920, or a combination or component of these systems.

The computer system 1000 includes a processor 1002, a cache 1004, and one or more executable modules and drivers, stored on a computer-readable medium, directed to the described processes. Additionally, the computer system 1000 includes a high performance input/output (I/O) bus 1006 and a standard I/O bus 1008. A host bridge 1010 couples processor 1002 to high performance I/O bus 1006, whereas I/O bus bridge 1012 couples the two buses 1006 and 1008 to each other. A system memory 1014 and one or more network interfaces 1016 couple to high performance I/O bus 1006. The computer system 1000 can further include video memory and a display device coupled to the video memory (not shown). Mass storage 1018 and I/O ports 1020 couple to the standard I/O bus 1008. The computer system 1000 can optionally include a keyboard and pointing device, a display device, or other input/output devices (not shown) coupled to the standard I/O bus 1008. Collectively, these elements are intended to represent a broad category of computer hardware systems, including but not limited to computer systems based on the x86-compatible processors manufactured by Intel Corporation of Santa Clara, Calif., and the x86-compatible processors manufactured by Advanced Micro Devices (AMD), Inc., of Sunnyvale, Calif., as well as any other suitable processor.

An operating system manages and controls the operation of the computer system 1000, including the input and output of data to and from software applications (not shown). The operating system provides an interface between the software applications being executed on the system and the hardware components of the system. Any suitable operating system can be used, such as the LINUX Operating System, the Apple Macintosh Operating System, available from Apple Computer Inc. of Cupertino, Calif., UNIX operating systems, Microsoft® Windows® operating systems, BSD operating systems, and the like. Other implementations are possible.

The elements of the computer system 1000 are described in greater detail below. In particular, the network interface 1016 provides communication between the computer system 1000 and any of a wide range of networks, such as an Ethernet (e.g., IEEE 802.3) network, a backplane, etc. The mass storage 1018 provides permanent storage for the data and programming instructions to perform the above-described processes and features implemented by the respective computing systems identified above, whereas the system memory 1014 (e.g., DRAM) provides temporary storage for the data and programming instructions when executed by the processor 1002. The I/O ports 1020 can be one or more serial or parallel communication ports, which provide communication between additional peripheral devices that can be coupled to the computer system 1000.

The computer system 1000 can include a variety of system architectures, and various components of the computer system 1000 can be rearranged. For example, the cache 1004 can be on-chip with processor 1002. Alternatively, the cache 1004 and the processor 1002 can be packed together as a "processor module," with processor 1002 being referred to as the "processor core." Furthermore, certain embodiments of the invention might neither require nor include all of the above components. For example, peripheral devices coupled to the standard I/O bus 1008 can couple to the high performance I/O bus 1006. In addition, in some embodiments, only a single bus might exist, with the components of the computer system 1000 being coupled to the single bus. Moreover, the computer system 1000 might include additional components, such as additional processors, storage devices, or memories.

In general, the described processes can be implemented as part of an operating system or a specific application, component, program, object, module, or series of instructions referred to as "programs." For example, one or more programs can be used to execute specific processes. The programs typically comprise one or more instructions in various memory and storage devices in the computer system 1000 that, when read and executed by one or more processors, cause the computer system 1000 to perform operations to execute the described processes. The described processes can be implemented in software, firmware, hardware (e.g., an application specific integrated circuit), or any combination of these.

In one implementation, the described processes are implemented as a series of executable modules run by the computer system 1000, individually or collectively in a distributed computing environment. The foregoing modules can be realized by hardware, executable modules stored on a computer-readable medium (or machine-readable medium), or a combination of both. For example, the modules can comprise a plurality or series of instructions to be executed by a processor in a hardware system, such as the processor 1002. Initially, the series of instructions can be stored on a storage device, such as the mass storage 1018. However, the series of instructions can be stored on any suitable computer readable storage medium. Furthermore, the series of instructions need not be stored locally, and could be received from a remote storage device, such as a server on a network, via the network interface 1016. The instructions are copied from the storage device, such as the mass storage 1018, into the system memory 1014 and then accessed and executed by the processor 1002. In various implementations, a module or modules can be executed by a processor or multiple processors in one or multiple locations, such as multiple servers in a parallel processing environment.

Examples of computer-readable media include, but are not limited to, recordable type media such as volatile and non-volatile memory devices; solid state memories; floppy and other removable disks; hard disk drives; magnetic media; optical disks (e.g., Compact Disk Read-Only Memory (CD ROMS), Digital Versatile Disks (DVDs)); other similar non-transitory (or transitory), tangible (or non-tangible) storage medium; or any type of medium suitable for storing, encoding, or carrying a series of instructions for execution by the computer system 800 to perform any one or more of the described processes.

It should be appreciated from the foregoing description that the present invention provides methods, systems, and non-transitory computer readable media configured to partition a non-repeating, ornate, three-dimensional design into a plurality of segments that can be easily manufactured and inexpensively assembled to provide a seamless, three-dimensional design over a building surface area.

For purposes of explanation, numerous specific details are outlined to provide a thorough understanding of the description. It will be apparent, however, to one skilled in the art that embodiments of the disclosure can be practiced without these specific details. In some instances, modules, structures, processes, features, and devices are shown in block diagram form to avoid obscuring the description. In other instances, functional block diagrams and flow diagrams are shown to represent data and logic flows. The components of block diagrams and flow diagrams (e.g., modules, blocks, structures, devices, features, etc.) can be variously combined, separated, removed, reordered, and replaced in a manner other than as expressly described and depicted.

Reference in this specification to "one embodiment," "an embodiment," "other embodiments," "one series of embodiments," "some embodiments," "various embodiments," or the like means that a particular feature, design, structure, or characteristic described in connection with the embodiment is included in at least one embodiment of the disclosure. The appearances of, for example, the phrase "in one embodiment" or "in an embodiment" in various places in the specification are not necessarily all referring to the same embodiment, nor are separate or alternative embodiments mutually exclusive of other embodiments. Moreover, whether there is express reference to an "embodiment" or the like, various features are described, which can be variously combined and included in some embodiments, but also variously omitted in other embodiments. Similarly, various features are described that might be preferences or requirements for some embodiments, but not other embodiments.

Specific methods, devices, and materials are described, although any methods and materials similar or equivalent to those described can be used in the practice or testing of the present embodiment. Each feature or concept is independent, but can be combined with any other feature or concept disclosed in this application.

Unless defined otherwise, all technical and scientific terms used in this application have the same meanings as commonly understood by one of ordinary skill in the art to which this embodiment belongs. The terms "a," "an," and "at least one" encompass one or more of the specified element. That is, if two of a particular element are present, one of these elements is also present and thus "an" element is present. The terms "a plurality of" and "plural" mean two or more of the specified element. The term "or" used between the last two of a list of elements means any one or more of the listed elements. For example, the phrase "A, B, or C" means "A, B, and/or C," which means "A," "B," "C," "A and B," "A and C," "B and C," or "A, B, and C."

Without further elaboration, it is believed that one skilled in the art, using the proceeding description, can make and use the present invention to the fullest extent. The invention has been described in detail with reference only to the presently preferred embodiments. Persons skilled in the art will appreciate that various modifications can be made without departing from the invention. Accordingly, the invention is defined only by the following claims.

The invention claimed is:

1. A computer-implemented method comprising:
receiving, by a computing system, dimensions of a building surface, including a surface length and a surface height;
receiving, by the computing system, dimensions of a surface material unit, including a material length and a material height;
receiving, by the computing system, design parameters defining a three-dimensional design over the building surface;
partitioning, by the computing system, the three-dimensional design into a plurality of three-dimensional segments based on both the three-dimensional design and the dimensions of the surface material unit; and
generating, by the computing system, a set of milling instructions for cutting a plurality of surface material units into the plurality of three-dimensional segments and using the milling instructions to mill a workpiece;

wherein the design parameters comprise a design element and one of a plurality of design styles; wherein the design element comprises an image element, a drawn element, or both;

wherein each of the plurality of design styles comprises a predefined value for each of a plurality of shape parameters, wherein the three-dimensional design comprises a first series of lines extending generally in a first direction, and wherein the partitioning the three-dimensional design comprises dividing each line in the first series of lines into a first set of points.

2. The computer-implemented method of claim 1, wherein the plurality of shape parameters comprises at least two of: one first line-density parameter, one first point-resolution parameter, one first radius-of-attraction parameter, one first attraction-intensity parameter, one first minimum-depth parameter, one first maximum-depth parameter, one first function parameter, or one first line-thickness parameter; wherein the first line-density parameter defines a distance between lines in the first series of lines, the first point-resolution parameter defines a quantity of points in the first set of points, the first radius-of-attraction parameter defines a radius of attraction between the first set of points on the first series of lines and the design element, the first attraction-intensity parameter defines a degree of attraction between the first set of points on the first series of lines and the design element, the first minimum-depth parameter defines a minimum depth for the first series of lines, the first maximum-depth parameter defines a maximum depth for the first series of lines, the first function parameter comprises a first function that adds periodicity to the first series of lines, and the first line- thickness parameter defines a line thickness for the lines in the first series of lines.

3. The computer-implemented method of claim 2, wherein the surface height is less than or equal to the material height, and wherein the partitioning the three-dimensional design further comprises: iteratively setting lines in the first series of lines as seam lines if a horizontal distance between any point on a next line in the first series of lines and any point on a latest seam line exceeds a first dimensional threshold, wherein the first dimensional threshold is determined based on the material length.

4. The computer-implemented method of claim 2, wherein the surface length is less than or equal to the material length, and wherein the partitioning the three-dimensional design further comprises: iteratively setting lines in the first series of lines as seam lines if a vertical distance between any point on a next line in the first series of lines and any point on a latest seam line exceeds a first dimensional threshold, wherein the first dimensional threshold is determined based on the material height.

5. The computer-implemented method of claim 2, wherein the three- dimensional design further comprises a second series of lines extending generally in a second direction, wherein the first direction is different from the second direction; and wherein the partitioning the three-dimensional design further comprises dividing each line in the second series of lines into a second set of points.

6. The computer-implemented method of claim 5, wherein the plurality of shape parameters further comprises at least two of: one second line-density parameter, one second point-resolution parameter, one second radius-of-attraction parameter, one second attraction-intensity parameter, one second minimum-depth parameter, one second maximum-depth parameter, one second function parameter, or one second line-thickness parameter; wherein the second line-density parameter defines a distance between lines in the second series of lines, the second point-resolution parameter defines a quantity of points in the second set of points, the second radius-of-attraction parameter defines a radius of attraction between the second set of points on the second series of lines and the design element, the second attraction- intensity parameter defines a degree of attraction between the second set of points on the second series of lines and the design element, the second minimum-depth parameter defines a minimum depth for the second series of lines, the second maximum-depth parameter defines a maximum depth for the second series of lines, the second function parameter comprises a second function that adds periodicity to the second series of lines, and the second line-thickness parameter defines a line thickness for the lines in the second series of lines.

7. The computer-implemented method of claim 5, further comprising:
receiving, by the computing system, a second of the plurality of design styles for a modified three-dimensional design;
adjusting, by the computing system, one or a combination of the first series of lines and the second series of lines based on the second of the plurality of design styles; and
repartitioning, by the computing system, the modified three-dimensional design into a modified plurality of segments based on the modified three-dimensional design and the dimensions of the surface material unit.

8. A system comprising:
at least one processor; and
a memory storing instructions that, when executed by the at least one processor, cause the system to perform a method comprising:
receiving dimensions of a building surface, including a surface length and a surface height;
receiving dimensions of a surface material unit, including a material length and a material height;
receiving design parameters defining a three-dimensional design over the building surface;
partitioning the three-dimensional design into a plurality of three-dimensional segments based on both the three-dimensional design and the dimensions of the surface material unit; and
generating a set of milling instructions for cutting a plurality of surface material units into the plurality of three-dimensional segments and using the milling instructions to mill a workpiece;
wherein the design parameters comprise a design element and one of a plurality of design styles;
wherein the design element comprises an image element, a drawn element, or both;
wherein each of the plurality of design styles comprises a predefined value for each of a plurality of shape parameters; and
wherein the three-dimensional design comprises a first series of lines extending generally in a first direction, and wherein the partitioning the three-dimensional design comprises dividing each line in the first series of lines into a first set of points.

9. The system of claim 8, wherein the plurality of shape parameters comprises at least two of: one first line-density parameter, one first point-resolution parameter, one first radius-of-attraction parameter, one first attraction-intensity parameter, one first minimum-depth parameter, one first maximum-depth parameter, one first function parameter, or one first line-thickness parameter; wherein the first line-density parameter defines a distance between lines in the first series of lines, the first point-resolution parameter defines a quantity of points in the first set of points, the first radius-of-attraction parameter defines a radius of attraction between the first set of points on the first series of lines and the design element, the first attraction-intensity parameter defines a degree of attraction between the first set of points on the first series of lines and the design element, the first minimum-depth parameter defines a minimum depth for the first series of lines, the first maximum-depth parameter defines a maximum depth for the first series of lines, the first function parameter comprises a first function that adds periodicity to the first series of lines, and the first line-thickness parameter defines a line thickness for the lines in the first series of lines.

10. The system of claim 9, wherein the surface height is less than or equal to the material height, wherein the partitioning the three-dimensional design further comprises: iteratively setting lines in the first series of lines as seam lines if a horizontal distance between any point on a next line in the first series of lines and any point on a latest seam line exceeds a first dimensional threshold, wherein the first dimensional threshold is determined based on the material length.

11. The system of claim 9, wherein the three-dimensional design further comprises a second series of lines extending generally in a second direction; wherein the first direction is different from the second direction; and
  wherein the partitioning the three- dimensional design further comprises dividing each line in the second series of lines into a second set of points.

12. The system of claim 11, wherein the plurality of shape parameters further comprises at least two of: one second line-density parameter, one second point-resolution parameter, one second radius-of-attraction parameter, one second attraction-intensity parameter, one second minimum-depth parameter, one second maximum-depth parameter, one second function parameter, or one second line-thickness parameter; wherein the second line-density parameter defines a distance between lines in the second series of lines, the second point-resolution parameter defines a quantity of points in the second set of points, the second radius-of-attraction parameter defines a radius of attraction between the second set of points on the second series of lines and the design element, the second attraction-intensity parameter defines a degree of attraction between the second set of points on the second series of lines and the design element, the second minimum-depth parameter defines a minimum depth for the second series of lines, the second maximum-depth parameter defines a maximum depth for the second series of lines, the second function parameter comprises a second function that adds periodicity to the second series of lines, and the second line-thickness parameter defines a line thickness for the lines in the second series of lines.

13. A non-transitory computer-readable storage medium including instructions that, when executed by at least one processor of a computing system, cause the computing system to perform a method comprising:
  receiving dimensions of a building surface, including a surface length and a surface height;
  receiving dimensions of a surface material unit, including a material length and a material height;
  receiving design parameters defining a three-dimensional design over the building surface;
  partitioning the three-dimensional design into a plurality of three-dimensional segments based on both the three-dimensional design and the dimensions of the surface material unit; and
  generating a set of milling instructions for cutting a plurality of surface material units into the plurality of three-dimensional segments and using the milling instructions to mill a workpiece;
  wherein the design parameters comprise a design element and one of a plurality of design styles;
  wherein the design element comprises an image element, a drawn element, or both;
  wherein each of the plurality of design styles comprises a predefined value for each of a plurality of shape parameters;
  wherein the three-dimensional design comprises a first series of lines extending generally in a first direction, and
  wherein the partitioning the three-dimensional design comprises dividing each line in the first series of lines into a first set of points.

14. The non-transitory computer-readable storage medium of claim 13, wherein the plurality of shape parameters comprises at least two of: one first line-density parameter, one first point-resolution parameter, one first radius-of-attraction parameter, one first attraction-intensity parameter, one first minimum-depth parameter, one first maximum-depth parameter, one first function parameter, or one first line-thickness parameter; wherein the first -density parameter defines a distance between lines in the first series of lines, the first point- resolution parameter defines a quantity of points in the first set of points, the first radius-of-attraction parameter defines a radius of attraction between the first set of points on the first series of lines and the design element, the first attraction-intensity parameter defines a degree of attraction between the first set of points on the first series of lines and the design element, the first minimum-depth parameter defines a minimum depth for the first series of lines, the first maximum-depth parameter defines a maximum depth for the first series of lines, the first function parameter comprises a first function that adds periodicity to the first series of lines, and the first line-thickness parameter defines a line thickness for the lines in the first series of lines.

15. The non-transitory computer-readable storage medium of claim 14, wherein the surface height is less than or equal to the material height, wherein the partitioning the three-dimensional design further comprises:
  iteratively setting lines in the first series of lines as seam lines if a horizontal distance between any point on a next line in the first series of lines and any point on a latest seam line exceeds a first dimensional threshold, wherein the first dimensional threshold is determined based on the material length.

16. The non-transitory computer-readable storage medium of claim 14, wherein the three-dimensional design further comprises a second series of lines extending generally in a second direction; wherein the first direction is different from the second direction; and wherein the partitioning the three-dimensional design further comprises dividing each line in the second series of lines into a second set of points.

17. The non-transitory computer-readable storage medium claim 16, wherein the plurality of shape parameters further comprises at least two of: one second line- density parameter, one second point-resolution parameter, one second radius-of-attraction parameter, one second attraction-intensity parameter, one second minimum-depth parameter, one second maximum-depth parameter, one second function parameter, or one second line-thickness parameter; wherein the second line-density parameter defines a distance between lines in the second series of lines, the second point-resolution parameter defines a quantity of points in the second set of points, the second radius-of-attraction parameter defines a radius of attraction between the second set of points on the second series of lines and the design element, the second attraction-intensity parameter defines a degree of attraction between the second set of points on the second series of lines and the design element, the second minimum-depth parameter defines a minimum depth for the second series of lines, the second maximum-depth parameter defines a maximum depth for the second series of lines, the second function parameter comprises a second function that adds periodicity to the second series of lines, and the second line-thickness parameter defines a line thickness for the lines in the second series of lines.

\* \* \* \* \*